US008780974B2

(12) United States Patent
Senoue et al.

(10) Patent No.: US 8,780,974 B2
(45) Date of Patent: Jul. 15, 2014

(54) DIGITAL PLL CIRCUIT AND COMMUNICATION DEVICE

(75) Inventors: Fumiaki Senoue, Osaka (JP); Kouji Okamoto, Osaka (JP)

(73) Assignee: Panasonic Corporation, Osaka (JP)

( * ) Notice: Subject to any disclaimer, the term of this patent is extended or adjusted under 35 U.S.C. 154(b) by 790 days.

(21) Appl. No.: 13/049,645

(22) Filed: Mar. 16, 2011

(65) Prior Publication Data

US 2011/0164675 A1 Jul. 7, 2011

Related U.S. Application Data

(63) Continuation of application No. PCT/JP2009/001140, filed on Mar. 13, 2009.

(30) Foreign Application Priority Data

Oct. 23, 2008 (JP) ................................. 2008-273476

(51) Int. Cl.
*H04N 7/12* (2006.01)
*H03L 7/091* (2006.01)
*H03L 7/087* (2006.01)

(52) U.S. Cl.
CPC .............. *H03L 7/087* (2013.01); *H03L 7/091* (2013.01); *H03L 2207/50* (2013.01)
USPC .................................................... 375/240.01

(58) Field of Classification Search
CPC ....... H04N 7/12; H03L 7/085; H03L 2207/50
USPC ...................................................... 375/240.01
See application file for complete search history.

(56) References Cited

U.S. PATENT DOCUMENTS

| 6,137,326 | A  | * | 10/2000 | Ogawa ......................... 327/156 |
| 6,429,693 | B1 |   | 8/2002  | Staszewski et al. |
| 6,687,841 | B1 | * | 2/2004  | Marukawa ................... 713/500 |
| 7,046,098 | B2 |   | 5/2006  | Staszewski |
| 7,948,290 | B2 | * | 5/2011  | Kato ............................. 327/159 |
| 2002/0191727 | A1 |  | 12/2002 | Staszewski et al. |

FOREIGN PATENT DOCUMENTS

| JP | 2002-076886 | 3/2002 |
| JP | 2008-160594 | 7/2008 |

* cited by examiner

*Primary Examiner* — Anner Holder
(74) *Attorney, Agent, or Firm* — McDermott Will & Emery LLP

(57) ABSTRACT

In a digital PLL circuit outputting a clock signal with a frequency obtained by multiplying a frequency of a reference signal by a frequency command word (a frequency ratio), an RPA serially adds a frequency command word containing a fractional component. An output of the RPA is input to a minute phase error generator. The phase error generator generates a plurality of threshold values close to an actual amplitude value of the reference signal based on the fractional portion of the serially added value of the frequency command word, calculates the amplitude value of the reference signal and a phase error of the reference signal corresponding to the amplitude value based on the threshold values, and calculates a minute phase error between the reference signal and the output clock.

12 Claims, 24 Drawing Sheets

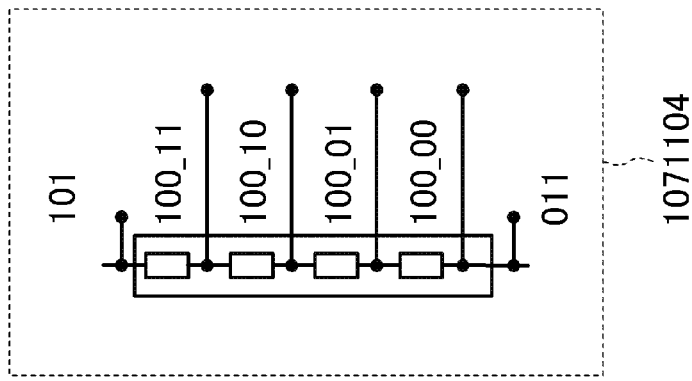
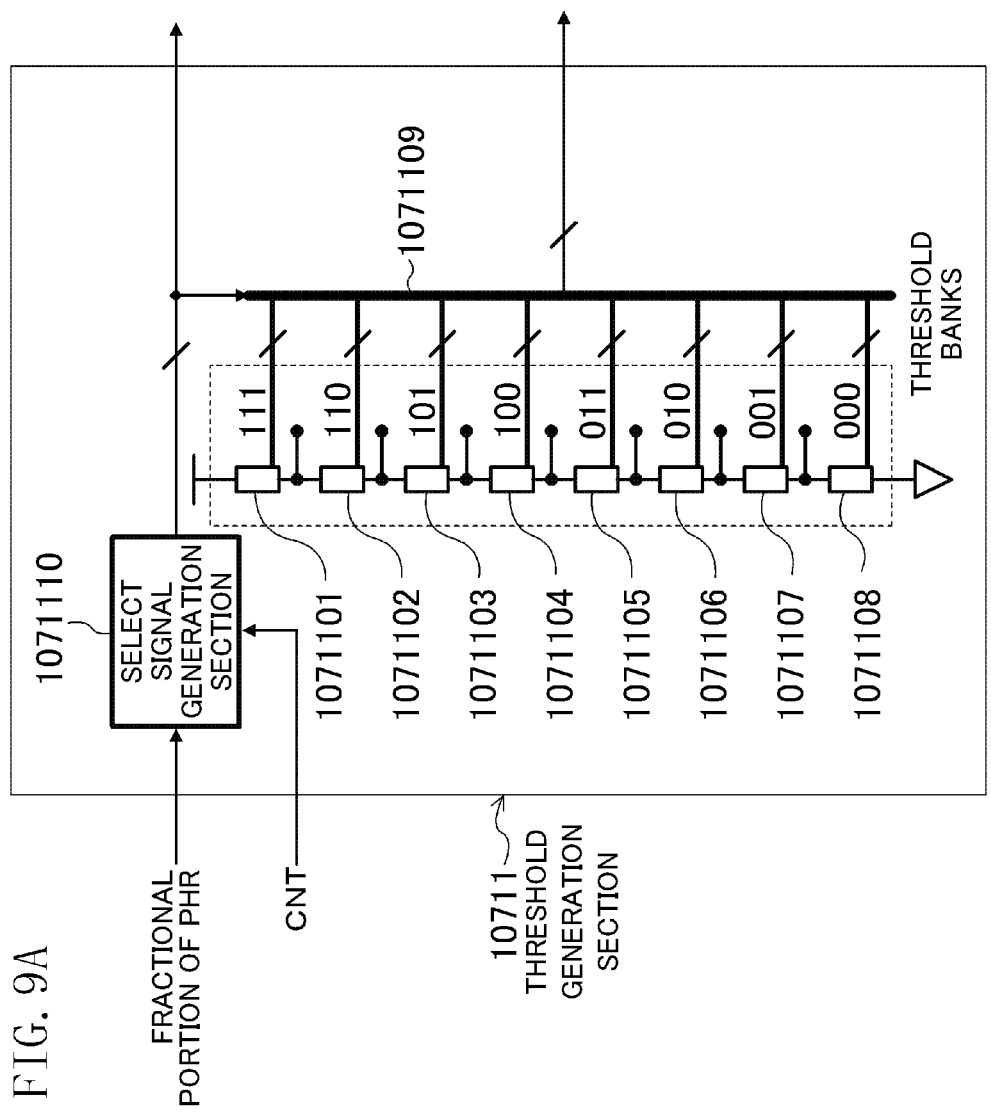

DIGITAL PLL CIRCUIT AND COMMUNICATION DEVICE

CROSS-REFERENCE TO RELATED APPLICATION

This is a continuation of PCT International Application PCT/JP2009/001140 filed on Mar. 13, 2009, which claims priority to Japanese Patent Application No. 2008-273476 filed on Oct. 23, 2008. The disclosures of these applications including the specifications, the drawings, and the claims are hereby incorporated by reference in their entirety.

BACKGROUND

The present disclosure relates to digital phase-locked loop (PLL) circuits outputting a clock signal with a frequency of a given magnification ratio, which is synchronized with a reference signal, and communication devices using the PLL circuits.

A conventional general digital PLL circuit includes, as shown in FIG. 20, a reference phase accumulator (RPA) 201 operating with a reference signal FREF, a variable phase accumulator (VPA) 202 operating with an output clock CKV, a phase comparator 203, a loop filter 204, and an oscillator 206.

The digital PLL circuit operates so that the frequency of the output clock CKV is frequency command word (FCW) times as large as the frequency of the reference signal FREF. For example, when an output clock of 225 MHz is to be obtained where the frequency of the reference signal FREF is 100 MHz, the frequency command word FCW may be set to 2.25. The RPA 201 is synchronized with the reference signal FREF, and integrates the frequency command word FCW to calculate a reference phase value RHR. On the other hand, the VPA 202 is synchronized with the output clock CKV and increments one to calculate a variable phase value PHV of the output clock CKV. The frequency command word FCW corresponds to the frequency of the output clock CKV normalized by the frequency of the reference signal FREF. Thus, where a phase update value of one pulse width of the reference signal FREF is the frequency command word FCW, one pulse of the output clock CKV is regarded as one phase update value. Therefore, the phase value PHR of the reference signal FREF and the phase value PHV of the output clock CKV can be compared at the same level. The phase comparator 203 obtains a difference between the phase value PHR of the reference signal FREF and the phase value PHV of the output clock CKV to calculate a phase error. The phase error is smoothed by the loop filter 204. An oscillation frequency of the oscillator 206 is controlled to a desired value by an output of the loop filter 204.

Where the value of the frequency command word FCW is an integer, the pulse number of the output clock CKV included in one pulse of the reference signal FREF is always a constant value (a frequency command word FCW), and is thus easily synchronized.

However, when the frequency command word FCW contains a fractional component, the pulse number of the output clock CKV included in one pulse of the reference signal FREF is not always constant. FIG. 21 is an operation timing chart of the PLL circuit shown in FIG. 20, where the frequency command word FCW is 2.25. As can be seen from FIG. 21, since the frequency ratio of the reference signal FREF to the output clock CKV is not always an integer, even if phase comparison is carried out to synchronize with the output clock CKV or the reference signal FREF, a minute residual phase error is always mixed in calculation of a phase error to degrade phase noise characteristics.

In order to solve the problem, Japanese Patent Publication No. 2002-76886 employs the configuration of a PLL circuit shown in FIG. 22. The block to be focused is a time-to-digital converter (TDC) 312 calculating a minute residual phase error. FIG. 23 illustrates the configuration of the TDC. The TDC 312 includes a delay line of the inverter chain 3121, a register group 3122 storing outputs of the delay line 3121 by edges of the reference signal FREF, an edge detector 3123 detecting time between edges of the reference signal FREF and the output clock CKV, and an output section 3124 calculating a minute phase error based on the result of the edge detection. Note that, in FIG. 22, 301 denotes an RPA, 302 denotes a VPA, 303 denotes a phase comparator, 304 denotes a loop filter, 305 denotes a control amount generator, 306 denotes an oscillator, 309 denotes a register circuit synchronized with the output clock CKV and generating a signal CKR, which obtained by retiming the reference signal FREF, and 310 denotes a register circuit operating in synchronization with the retiming signal CKR.

A calculation method of the minute phase error will be described below. The output clock CKV is input to the delay line 3121. That is, outputs of the inverters are delayed signals of the output clock CKV. Since the delay line 3121 is actually an inverter chain, the inverters at even number stages have the same polarity, and the inverters at odd number stages have the inverted polarity. Note that, as shown in FIG. 23, the polarity can be uniform by maintaining the integrity with outputs of the register group receiving the outputs of the inverters. As such, the polarity of the output clock CKV at the edges of the reference signal FREF is stored in the register group. In both cases where a phase error has a positive value as shown in FIG. 24A and where the phase error has a negative value as shown in FIG. 24C, data portions D[0], D[1], D[2], ..., which are gradually delayed by minute time, can be obtained from the register group 3122 as shown in FIG. 24B by the delay line 3121 and the register group 3122 shown in FIG. 24B. With use of the information, time Δtr between rising edges of the reference signal FREF and the output clock CKV, and time Δtf between falling edges of the reference signal FREF and the output clock CKV can be represented by digital values. An output section 3124 can calculate the minute phase error as shown in equations (1) using the time Δtr between the rising edges and the time Δtf between the falling edges.

$$Tv = 2 \times |\Delta tf - \Delta tr|$$

$$\epsilon = Tv - \Delta tr \qquad \text{Equations (1)}$$

(Where Tv is a Period of the Output Clock CKV1, and ε is the Minute Phase Error.)

Note that, the pulse interval of the output clock CKV needs to be normalized as one for calculation, a sufficient number of taps needs to be secured in the delay line for covering one pulse of the output clock CKV.

As such, in the configuration shown in Japanese Patent Publication No. 2002-76886, the TDC 312 extracts a minute phase error between the reference signal FREF and the output clock CKV to reflect in the PLL circuit, thereby obtaining a significant improvement in phase noise characteristics.

However, the area of the TDC 312 is structurally difficult to reduce, since an inverter chain with a sufficient length is needed to cover one period of the output clock CKV to detect the rising/falling edges of the reference signal FREF and the output clock CKV. Also, when a frequency magnification ratio FCW to the reference signal FREF becomes large, the speed of the clock signal CKV input to the inverter chain 3121 increases, thereby increasing power consumption. Furthermore, since outputs of the inverters need to be provided at regular time intervals, connections between the inverters need to equal lengths to increase the design difficulty.

SUMMARY

It is an objective of the present disclosure to provide a digital PLL circuit having excellent phase noise characteristics, and calculating a minute phase error between a reference signal and an output clock with a reduced area and low power consumption, where a frequency command word FCW, which is a frequency ratio of the output clock to the reference signal, contains a fractional component.

In order to achieve the objective, the present disclosure does not employ the configuration of conventional art in which time between rising and falling edges of the reference signal and the output clock are represented by digital values by using a delay line. The present disclosure employs calculating a minute phase error between a reference signal and an output clock using amplitude information of the reference signal. Specifically, zero, the maximum value, and the minimum value of the amplitude of the reference signal FREF to the frequency magnification ratio FCW corresponds to 1:1 as exemplified in FIG. 13. With use of the maximum value, the minimum value, etc. and an amplitude value a at a sampling point, a phase error perr_f at the sampling point can be calculated. In the configuration of error calculation using the amplitude information, since the reference phase accumulator (RPA) 201 in FIG. 20 serially adds the frequency magnification ratio FCW. Thus, where the frequency command word FCW is, for example, 2.25 (see FIG. 21), the fractional components of outputs of the RPA (the serially added values of the frequency magnification ratio FCW) are four types of 0.0, 0.25, 0.5, and 0.75, and the amplitude value α at the sampling point is close to the four values. Therefore, when detecting the amplitude value α, threshold values are not necessarily set finely and equally at multiple stages between the maximum amplitude value and the minimum amplitude value. The number of comparators can be reduced by setting the threshold values close to the four values. The present disclosure reduces the number of the comparators in this manner to provide a digital PLL circuit having excellent phase noise characteristics and calculating a minute phase error between a reference signal and an output clock with a reduced area and low power consumption.

Specifically, a digital PLL circuit according to the present disclosure receives a reference signal and outputs a clock signal with a frequency obtained by multiplying a frequency of the reference signal by a value indicating a predetermined magnification ratio and containing an integer portion and a fractional portion. The circuit includes a controlled oscillator configured to receive a control amount and change the frequency of the clock signal output from the digital PLL circuit in accordance with the received control amount; a first counter configured to count the clock signal with the frequency changed by the controlled oscillator; a second counter configured to increment the predetermined magnification ratio in response to a retiming signal obtained by retiming the reference signal with the clock signal from the controlled oscillator; a comparator configured to compare a count value of the first counter to an integer portion of a count value of the second counter and output the difference as a phase error of the integer portion; a minute phase error generator configured to generate a plurality of threshold values close to an amplitude value of the reference signal based on the fractional portion of the count value of the second counter, detect the amplitude value of the reference signal based on the plurality of threshold values, and generate minute phase error information as a phase error of the fractional portion between the reference signal and the output clock signal from the controlled oscillator based on the detected amplitude value; a filter section configured to receive the phase error of the integer portion from the comparator and the minute phase error information as the phase error of the fractional portion from the minute phase error generator, and smooth a sum of the two phase errors; and a control amount generator configured to generate and output the control amount for the oscillator based on an output of the filter section.

In the digital PLL circuit according to the present disclosure, the minute phase error generator includes a plurality of threshold banks, each configured to output a plurality of threshold values, a selection section configured to receive the fractional portion of the count value of the second counter, and select one of the plurality of threshold banks based on the fractional portion, and a plurality of comparators provided in number equal to the number of the threshold values output from the threshold bank selected by the selection section, and configured to receive a corresponding threshold value from the selected threshold bank, receive the reference signal, and compare the reference signal to the received threshold value.

In the digital PLL circuit according to the present disclosure, the minute phase error generator detects amplitude values of the reference signal a plurality of times based on the generated plurality of threshold values, and generates minute phase error information as a phase error of the fractional portion between the reference signal and the output clock signal from the controlled oscillator based on a maximum value, a minimum value, and an amplitude value just before the second counter increments the predetermined magnification ratio out of the detected plurality of amplitude values, and the predetermined magnification ratio containing the integer portion and the fractional portion.

In the digital PLL circuit according to the present disclosure, the minute phase error generator detects the amplitude value just before the second counter increments the predetermined magnification ratio at thinning of the clock signal output from the digital PLL circuit in accordance with an output of the first counter and an output of the second counter.

In the digital PLL circuit according to the present disclosure, the minute phase error generator switches the plurality of threshold banks and detects the maximum value and the minimum value of the amplitude values of the reference signal when the PLL circuit is in transition to normal operation or in a learning mode, and normalizes the minute phase error using the detected maximum and minimum values in the normal operation after the transition.

In the digital PLL circuit according to the present disclosure, the count value of the first counter and the count value of the second counter are stored in two respective register circuits synchronized with the retiming signal, and the comparator compares the count value of the first counter stored in one of the two register circuits to the integer portion of the count value of the second counter stored in the other register circuit.

In the digital PLL circuit according to the present disclosure, the control amount generation section outputs to the controlled oscillator, a result of modulating a part or whole of the control amount for the controlled oscillator as a control amount.

In the digital PLL circuit according to the present disclosure, the controlled oscillator includes a digital-to-analog converter and a voltage controlled oscillator.

In the digital PLL circuit according to the present disclosure, the controlled oscillator is a digital controlled oscillator.

In the digital PLL circuit according to the present disclosure, the reference signal has a waveform equivalent to a sine wave.

In the digital PLL circuit according to the present disclosure, the reference signal has a sowtooth waveform.

A communication device according to the present disclosure includes an LSI including a signal processing circuit configured to decode a received signal containing sound data and video data with a clock signal obtained by using the digital PLL circuit, and a display terminal configured to display the sound data or the video data decoded in response to a decoding signal from the LSI.

With this configuration, the minute phase error generator in the present disclosure generates the plurality of threshold values close to the amplitude value of the reference signal based on the fractional portion of the count value of the second counter (i.e., the serially added value of the frequency ratio), and detects the amplitude value of the reference signal with the plurality of comparators receiving the plurality of threshold values. The phase error of the fractional portion (the minute phase error information) between the reference signal and the output clock signal is generated based on the detected amplitude value.

As such, the plurality of threshold values for detecting the amplitude value of the reference signal are generated as threshold values close to the actual amplitude value of the reference signal based on the fractional portion of the serially added value of the frequency ratio. Thus, the amplitude value of the reference signal is accurately detected by using the comparators in the number equal to the number of the threshold values. Therefore, there is no need to provide a large number of comparators finely segmenting the difference between the maximum value and the minimum value of the amplitude of the reference signal into multiple stages, thereby reducing the area, power consumption, and design difficulty.

As described above, according to the digital PLL circuit of the present disclosure, the number of provided comparators can be reduced, even when a frequency command word (a frequency ratio) contains a fractional component. Therefore, the present disclosure provides a digital PLL circuit having excellent phase noise characteristics and calculating a minute phase error between a reference signal and an output clock with a reduced area and low power consumption.

BRIEF DESCRIPTION OF THE DRAWINGS

FIG. 9A illustrates an internal configuration of a threshold generation section included in the amplitude code generation section. FIG. 9B illustrates an internal configuration of a threshold bank included in the threshold generation section.

FIG. 24A illustrates the case where a phase error has a positive value. FIG. 24B illustrates a configuration of a delay line generating delayed data by minute time and a register group. FIG. 24C illustrates the case where the phase error has a negative value. FIG. 24D illustrates the data delayed by minute time.

DETAILED DESCRIPTION

Embodiments of the present disclosure will be described hereinafter with reference to the drawings.

First Embodiment

Figure 1:
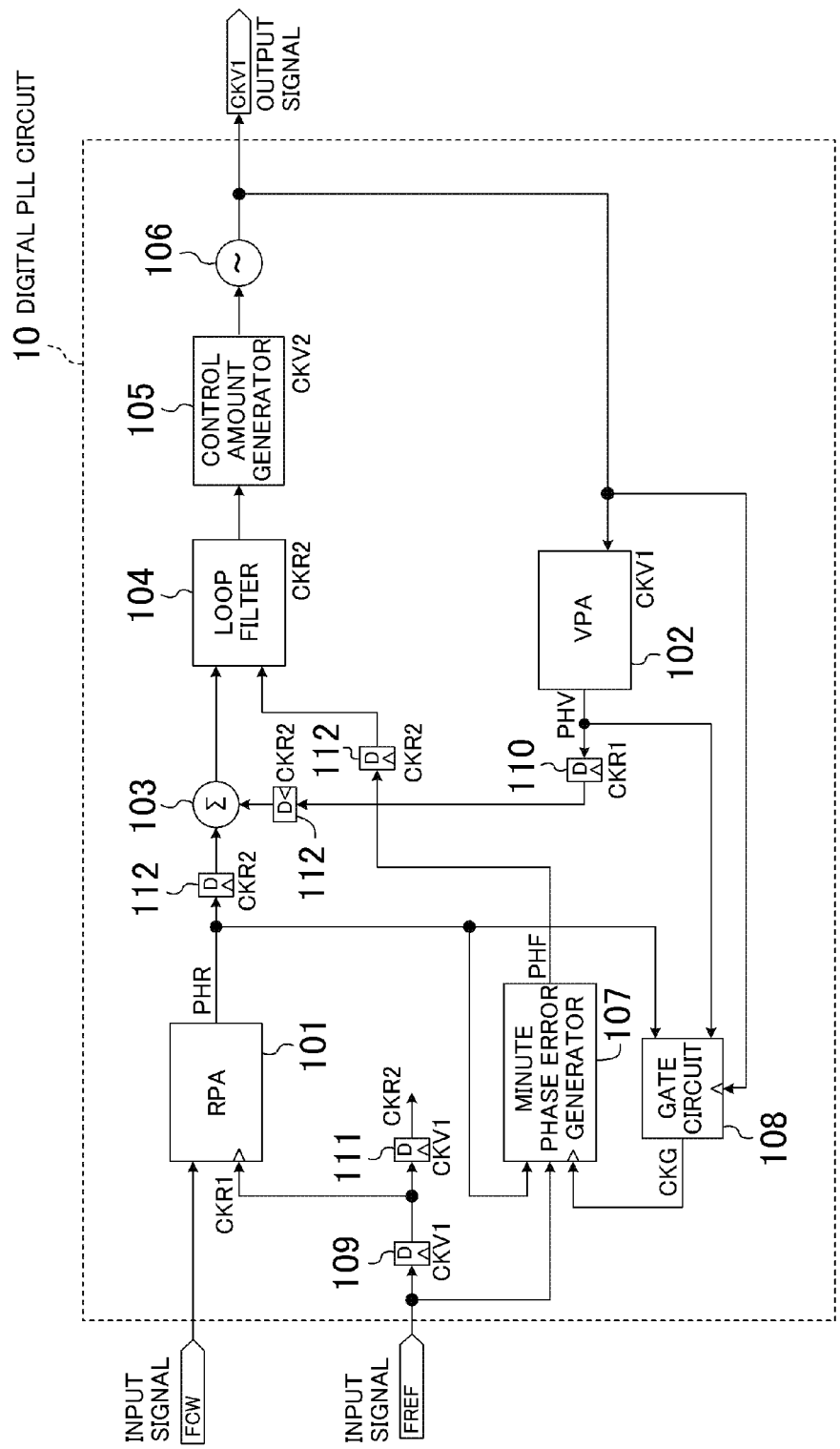
FIG. 1 is a block diagram illustrating the entire configuration of a digital PLL circuit according to a first embodiment of the present disclosure.

FIG. 1 illustrates a configuration of a digital PLL circuit according to a first embodiment of the present disclosure.

In FIG. 1, 101 denotes a reference phase accumulator (RPA), 102 denotes a variable phase accumulator (VPA), 103 denotes a phase comparator (comparator), 104 denotes a loop filter performing filtering on an input phase error group to smooth an error, 106 denotes a controlled oscillator, 105 denotes a control amount generator controlling the controlled oscillator 106, 107 denotes a minute phase error generator, 108 denotes a gate circuit generating operation timing of the minute phase error generator 107, 109 denotes a register circuit synchronized with an output clock CKV1 and generating a signal CKR1 obtained by retiming the reference signal FREF, 110 denotes a register circuit operating in synchronization with the retiming signal CKR1, 111 denotes a register circuit generating a signal CKR 2 obtained by delaying the retiming signal CKR1 by one clock, and 112 denotes a register circuit operating in synchronization with the retiming delay signal CKR2.

In the digital PLL circuit, the RPA 101 and the VPA 102 calculate a phase error of an integer portion between a reference signal FREF and an output clock signal CKV1. The minute phase error generator 107 calculates a fractional portion of the phase error. By combining them, the loop filter 104 performs smoothing. The control amount generator 105 generates a control code of the controlled oscillator 106 based on an output of the loop filter 104. Feedback control is performed so that the frequency of the output clock CKV1 of the controlled oscillator 106 eventually becomes frequency command word FCW times as large as the frequency of the reference signal FREF.

The configuration and operation of the digital PLL circuit shown in FIG. 1 will be described below in detail.

Figure 2:
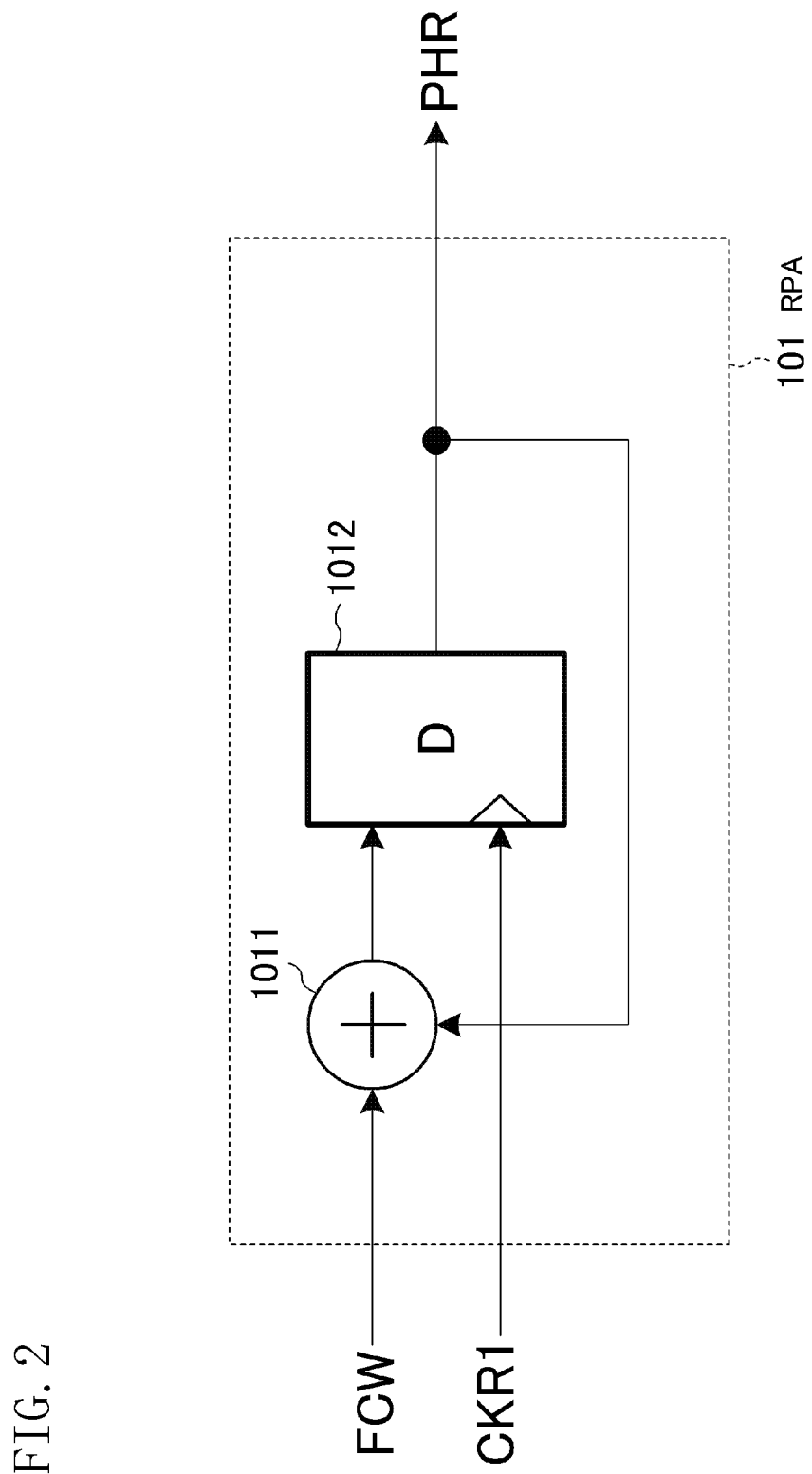
FIG. 2 illustrates an internal configuration of a reference phase accumulator (RPA) included in the digital PLL circuit.

FIG. 2 illustrates an example configuration of the RPA (a second counter) 101. Reference numeral 1011 denotes an adder, and 1012 denotes a register holding an output of the adder 1011 in synchronization with the retiming signal CKR1. The register 1012 receives a sum of the held value and a frequency command word FCW (integrates the value of the frequency command word FCW) at each rising edge of the retiming signal CKR1 to calculate a reference phase value RHR.

Figure 3:
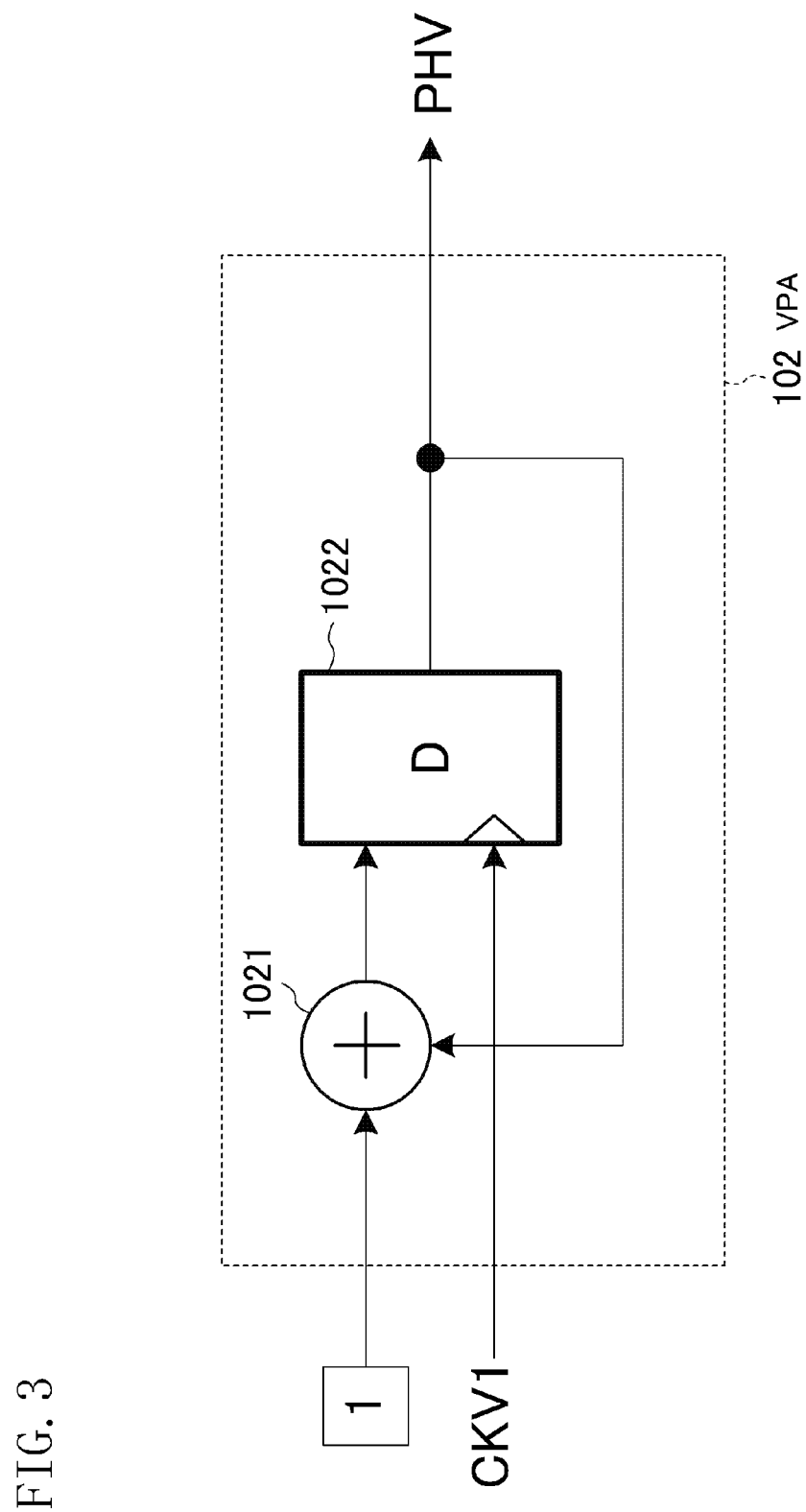
FIG. 3 illustrates an internal configuration of a variable phase accumulator (VPA) included in the digital PLL circuit.

Next, FIG. 3 illustrates an example configuration of the VPA (first counter) 102. Reference numeral 1021 denotes an adder, and 1022 denotes a register holding an output of the adder 1021 in synchronization with the retimed signal CKV1. The register 1022 receives a sum of the held value and one (increments +1) at each rising edge of the retimed signal CKV1 to calculate the variable phase value PHV of the output clock CKV1.

Figure 4:
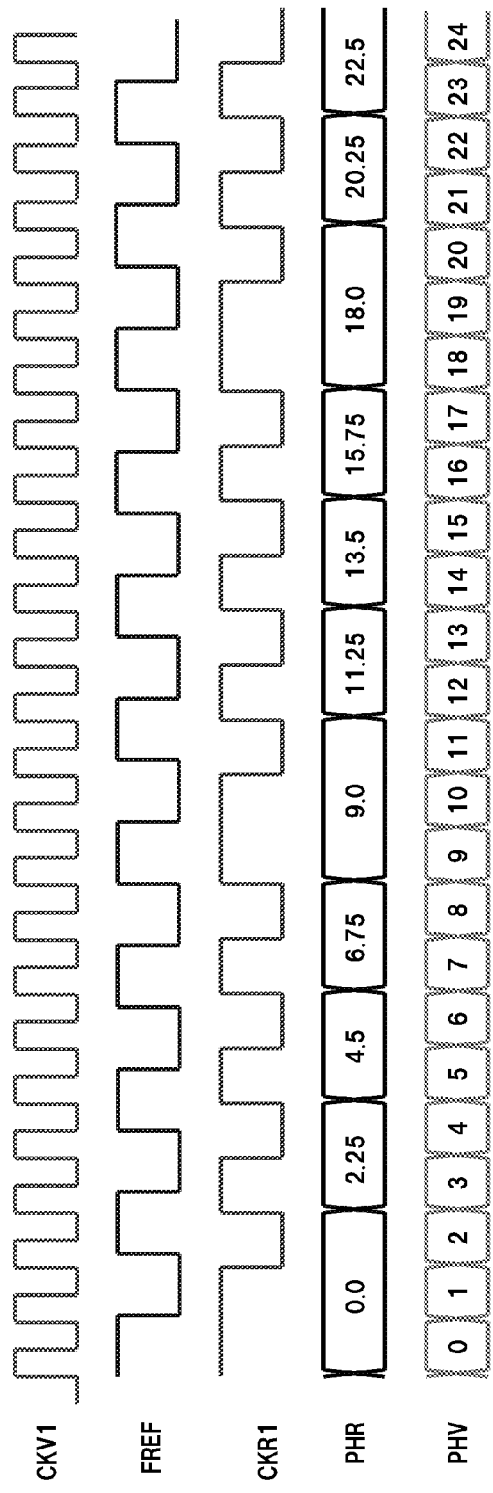
FIG. 4 is an operation timing chart of the RPA and the VPA.

FIG. 4 illustrates an operation timing chart of the RPA 101 shown in FIG. 2 and the VPA 102 shown in FIG. 3, where the frequency command word FCW is 2.25.

In FIG. 1, the phase comparator 103 compares a signal obtained by further retiming a signal which is the retimed variable phase value PHV of the output clock CKV1 with a retiming signal CKR1, with a retiming delay signal CKR2 in the register circuit 112 to the integer portion of a signal obtained by retiming the reference phase value RHR with the retiming delay signal CKR2 in the register circuit 112. Since one pulse of the output clock CKV1 is treated as "1," the phase error of the integer portion can be calculated by directly calculating the difference between the variable phase value PHV of the output clock CKV1 and the reference phase value RHR. Note that retiming with the retiming delay signal CKR2 is performed for timing adjustment with the minute phase error generator 107.

Figure 5:
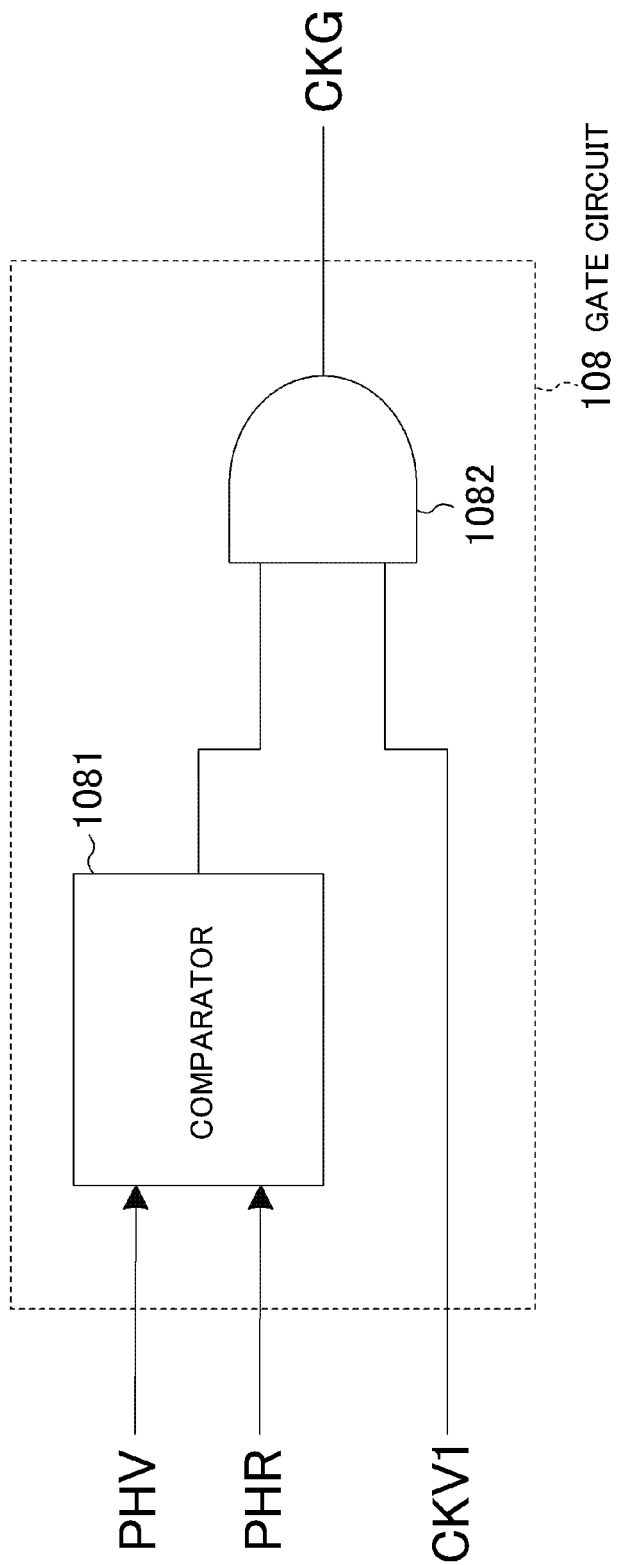
FIG. 5 illustrates an internal configuration of a gate circuit included in the digital PLL circuit.
Figure 6:
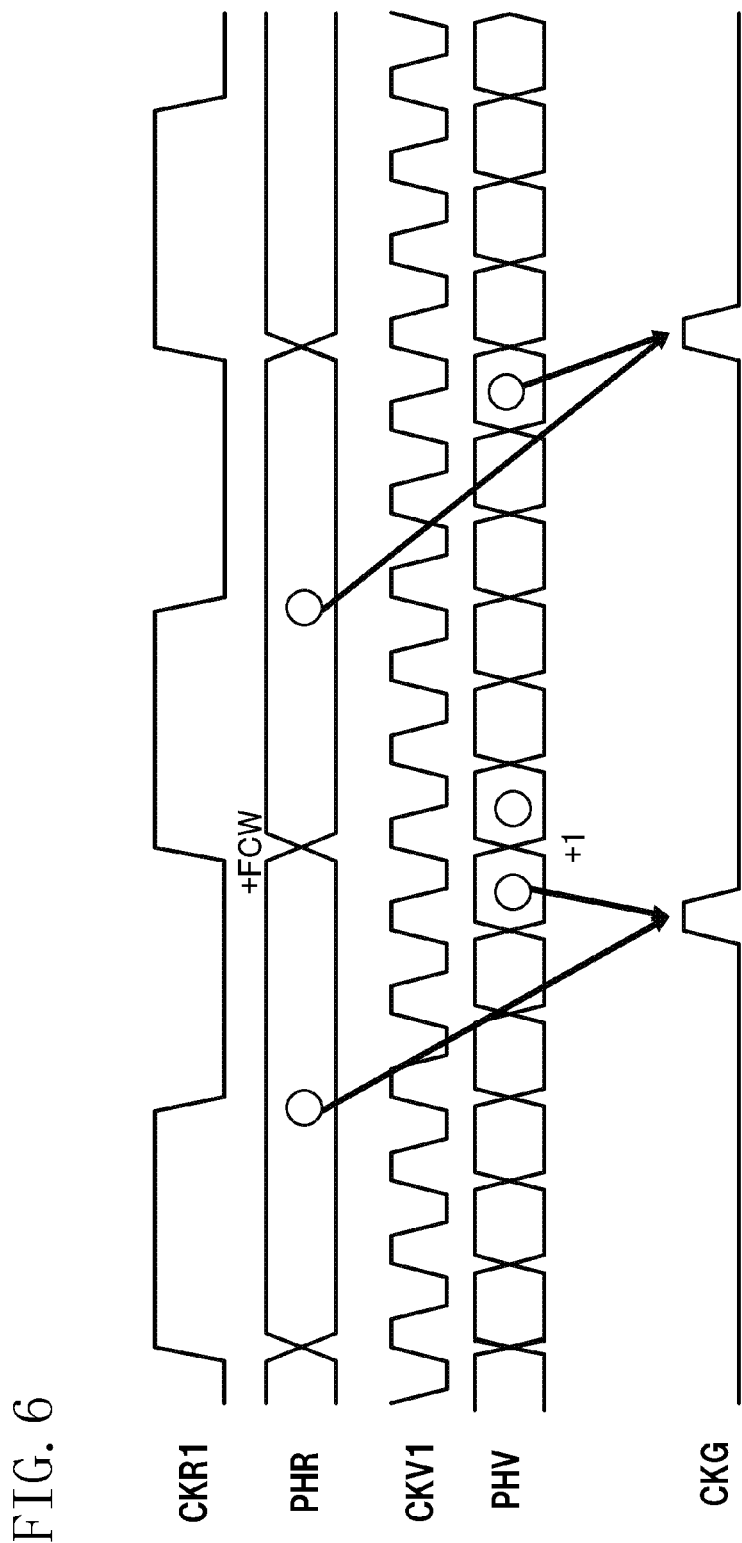
FIG. 6 is an operation timing chart of the gate circuit.

FIG. 5 illustrates an example configuration of the gate circuit 108. In the figure, 1081 denotes a comparator comparing the variable phase value PHV of the output clock CKV1 to the integer portion of the reference phase value RHR, and 1082 denotes an AND gate outputting a result of AND operation on an output of the comparator 1081 and the output clock CKV1. The comparator 1081 outputs "1," when the sum of "1" and the variable phase value PHV of the output clock CKV1 is equal to the integer portion of the sum of the reference phase value RHR and the frequency command word FCW. Otherwise, the comparator 1081 outputs "0." Since the AND gate 1082 outputs a result of AND operation on the output of the comparator 1081 and the output clock CKV1, mask processing of the output clock CKV1 is unlocked to output a control signal CKG, only when the variable phase value PHV of the output clock CKV1 is equal to the integer portion of the reference phase value RHR. The purpose of this is to operate the minute phase error generator 107 in synchronization with rising of the output clock CKV1 just prior to the rising of the retiming signal CKR1. FIG. 6 is an operation timing chart of the gate circuit 108 shown in FIG. 5.

Figure 7:
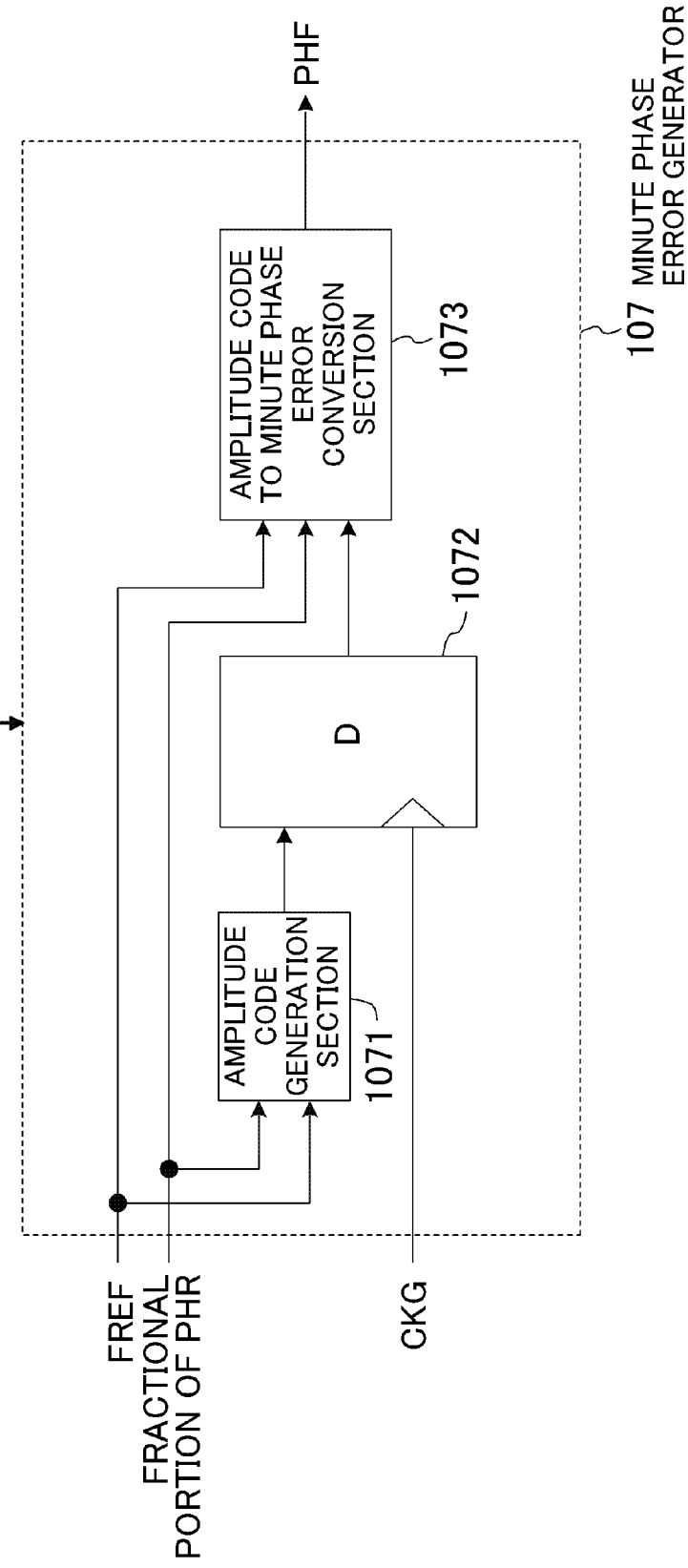
FIG. 7 illustrates an internal configuration of a minute phase error generator included in the digital PLL circuit.

Next, the configuration and operation of the minute phase error generator 107, which is important in the present disclosure, will be described below. FIG. 7 illustrates an example internal configuration of the minute phase error generator 107. The minute phase error generator 107 shown in FIG. 7 calculates a minute error based on the reference signal FREF and the fractional portion of the reference phase value RHR in synchronization with the control signal CKG of the gate circuit 108. Reference numeral 1071 denotes an amplitude code generation section generating an amplitude code from an amplitude value of the reference signal FREF, 1072 denotes a register driven by the control signal CKG, and 1073 denotes an amplitude code-to-minute phase error conversion section converting a generated amplitude code to a minute phase error. The register 1072 receives an amplitude code generated at the amplitude code generation section 1071 at each rising of the control signal CKG. The amplitude code-to-minute phase error conversion section 1073 calculates and outputs a minute phase error from the amplitude code held in the register 1072. The CNT signal shown in FIG. 7 is a signal output from a controller not shown in FIG. 1 and indicating that the PLL circuit is in a learning mode.

Figure 8:
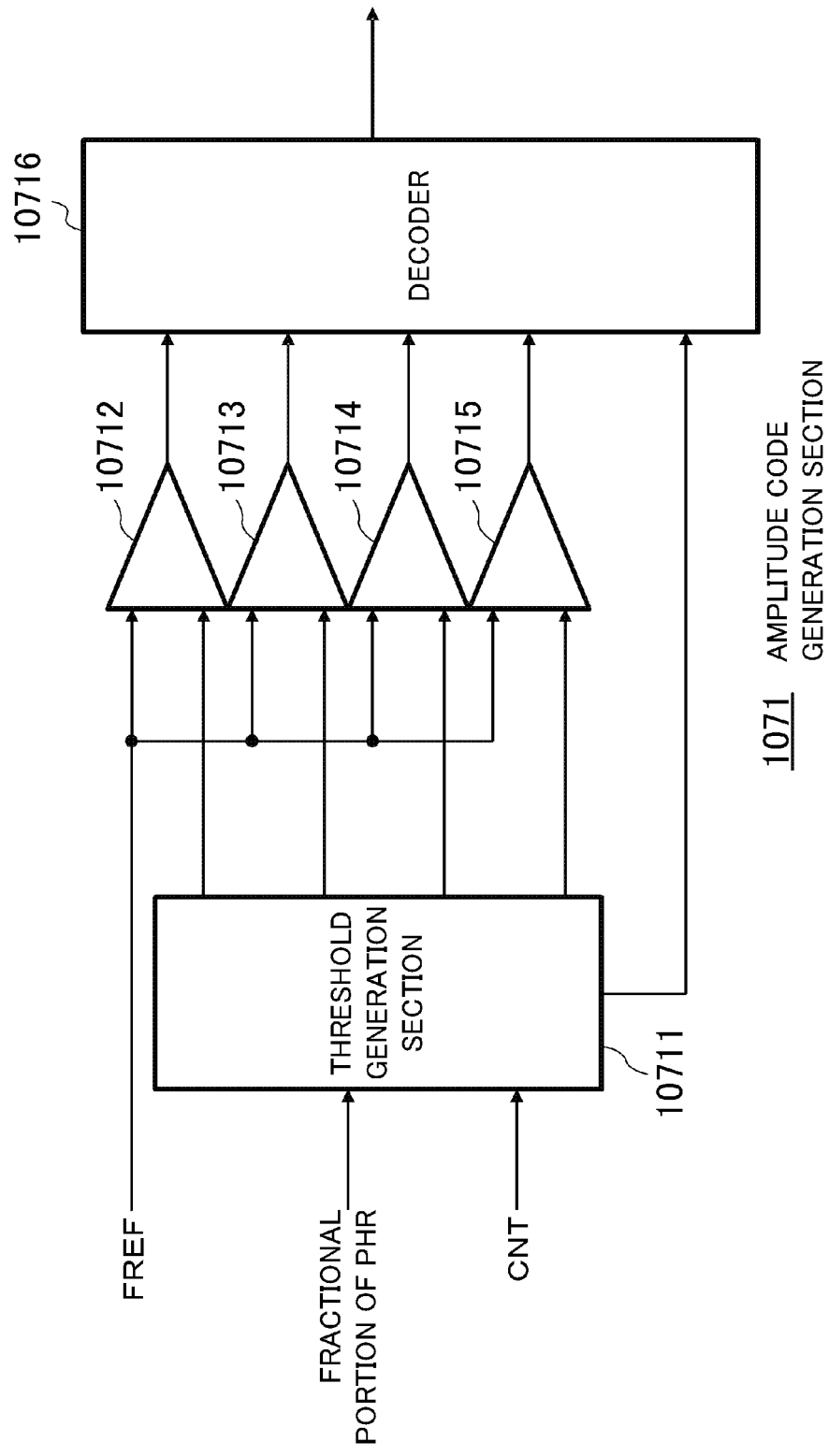
FIG. 8 illustrates an internal configuration of an amplitude code generation section included in the minute phase error generator.

Next, FIG. 8 illustrates a specific example configuration of the amplitude code generation section 1071 shown in FIG. 7. In the figure, 10712-10715 denote comparators, 10711 denotes a threshold generation section generating threshold values of the comparators 10712-10715 coupled to the outputs of the threshold generation section 10711, and 10716 is a decoder.

The threshold generation section 10711 includes, as shown in FIG. 9A, a plurality of threshold banks 1071101-1071108 in an amplitude direction, and selects and outputs a threshold value for converting the amplitude level of the reference signal FREF to a digital code. In this embodiment, eight threshold banks are used. The CNT signal indicates whether or not the PLL circuit is in a learning mode. When the PLL circuit is not in a learning mode, the select signal generation section (selection section) 1071110 determines based on the fractional portion of the reference phase value RHR, which threshold bank is optimum to convert the reference signal FREF at the timing of the control signal CKG and generates and outputs a select signal to the selector 1071109.

Figure 10:
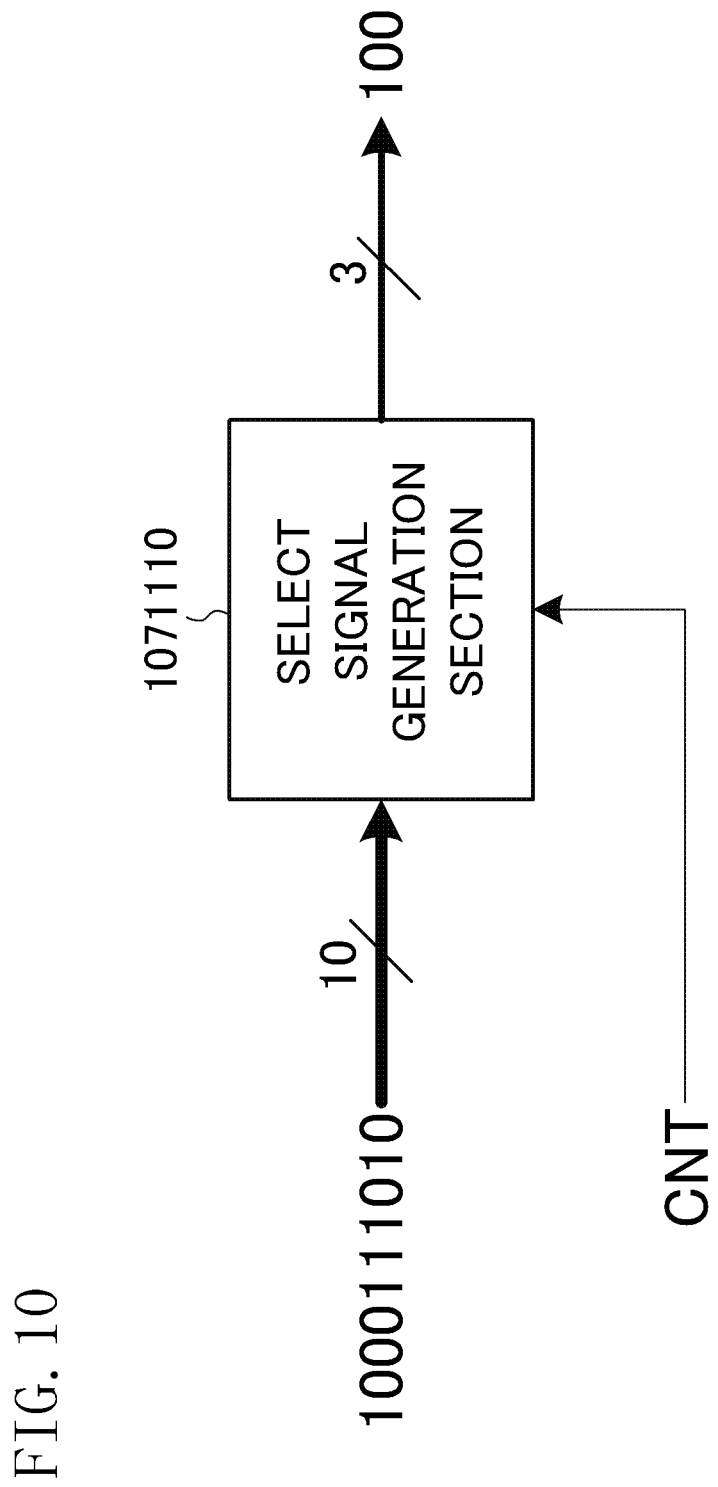
FIG. 10 illustrates a configuration of a select signal generation section included in the threshold generation section.

FIG. 10 illustrates an example configuration of the select signal generation section 1071110. Specifically, the select signal generation section 1071110 outputs high bits of the fractional portion of n bits of the reference phase value RHR in accordance with the number of the threshold banks. In FIG. 10, three high bits of the fractional portion of 10 bits of the PHR are output in accordance with the number of the threshold bank which is eight. Since tracking operation is completed when the minute phase error calculator 107 operates, high bits of the fractional portion of the reference phase value RHR can be used as a selector signal. As shown in FIG. 9B, four threshold values in selected one of the threshold banks are output as threshold values of the four comparators 10712-10715 in FIG. 8 to perform conversion. In the configuration of FIG. 9A, a select signal indicating which threshold bank is selected is output together with the threshold values. Based on outputs of the four comparators 10712-10715, and a signal indicating the bank position of the threshold generation section 10711, the decoder 10716 extracts and outputs amplitude information of the reference signal FREF at the timing of the control signal CKG. Since the amplitude code generation section 1071 has such a configuration, resolution in the amplitude direction is not degraded even when reducing the number of the comparators.

The amplitude information extracted in this manner is held in the register 1072 shown in FIG. 7 at the timing of the control signal CKG.

Figure 11:
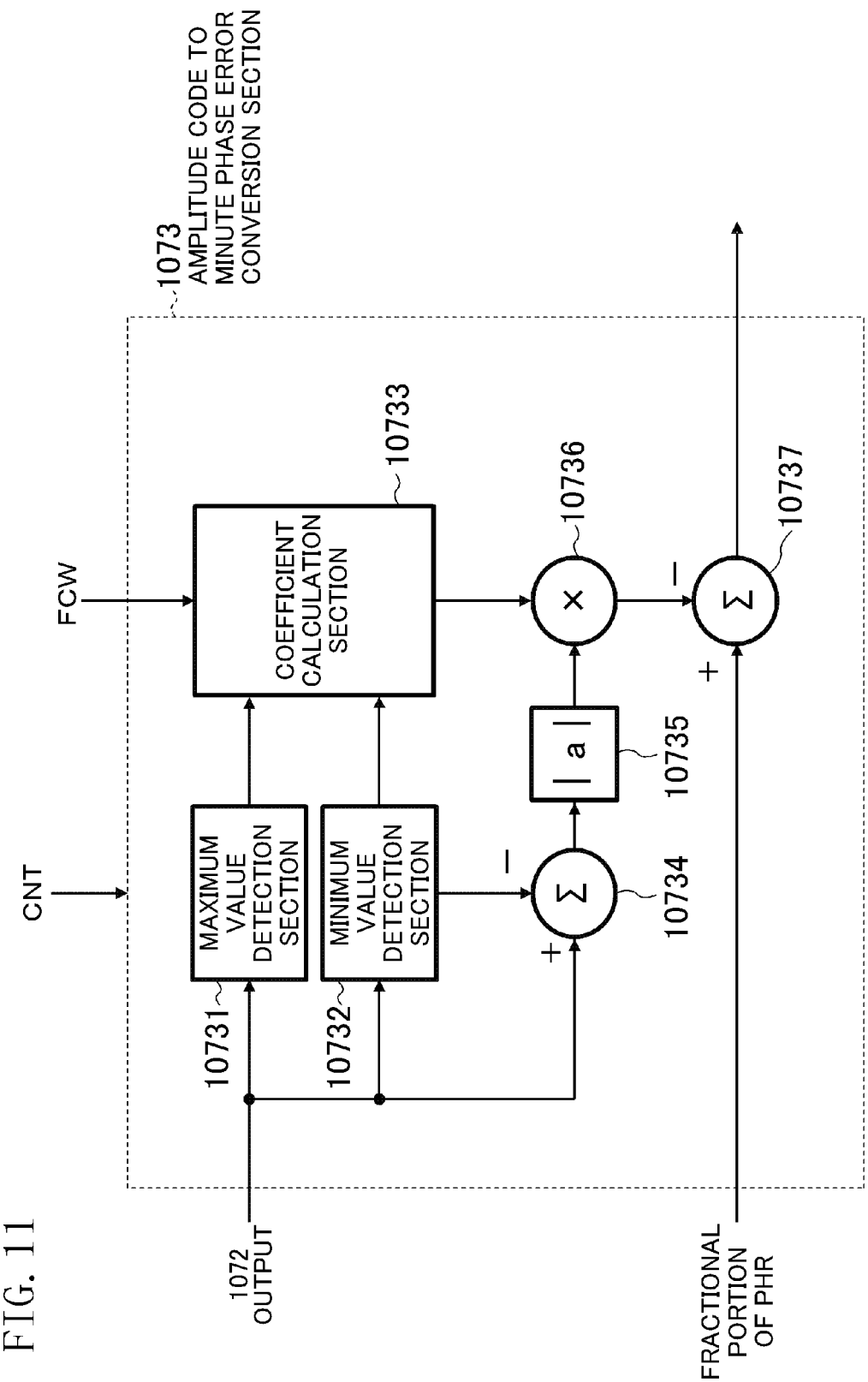
FIG. 11 illustrates an internal configuration of an amplitude code-to-minute phase error conversion section included in the minute phase error generator.

The amplitude code-to-minute phase error conversion section 1073 shown in FIG. 7 normalizes a minute phase error. FIG. 11 illustrates an example configuration of the amplitude code-to-minute phase error conversion section 1073. In the figure, 10731 denotes a maximum value detection section detecting and holding the maximum value of the output of the register circuit 1072, and 10732 denotes a minimum value detection section detecting and holding the minimum value of the output of the register circuit 1072. Reference numeral 10733 denotes a coefficient calculation section, which calculates and outputs a normalization coefficient based on the frequency command word FCW, an output of the maximum value detection section 10731, and an output of the minimum value detection section 10732. Reference numeral 10734 denotes a subtractor subtracting the minimum value of the minimum value detection section 10732 from the output of the register circuit 1072. Reference numeral 10735 denotes an absolute value calculation section obtaining the absolute value of an output of the subtractor 10734. Reference numeral 10736 denotes a multiplier multiplying an output of the absolute value calculation section 10735 by the coefficient calculated by the coefficient calculation section 10733. Reference numeral 10737 denotes a subtractor subtracting an output of the multiplier 10736 from the fractional portion of the reference phase value RHR of the RPA 101 and outputs the result of the subtraction as a minute phase error.

The output of the decoder 10716 of FIG. 8 is for encoding amplitude information of the reference signal FREF, and thus, needs to be normalized so that the output of the decoder 10716 can be compared to the reference phase value RHR, which is a reference where a minute phase error is calculated. Therefore, when a learning signal CNT is asserted, while bringing the PLL circuit under free-running operation and switching threshold banks, the maximum value (MAX) and the minimum value (MIN) of the reference signal FREF are detected, which are used to normalize the minute phase error in normal operation after a transition period.

Figure 12:
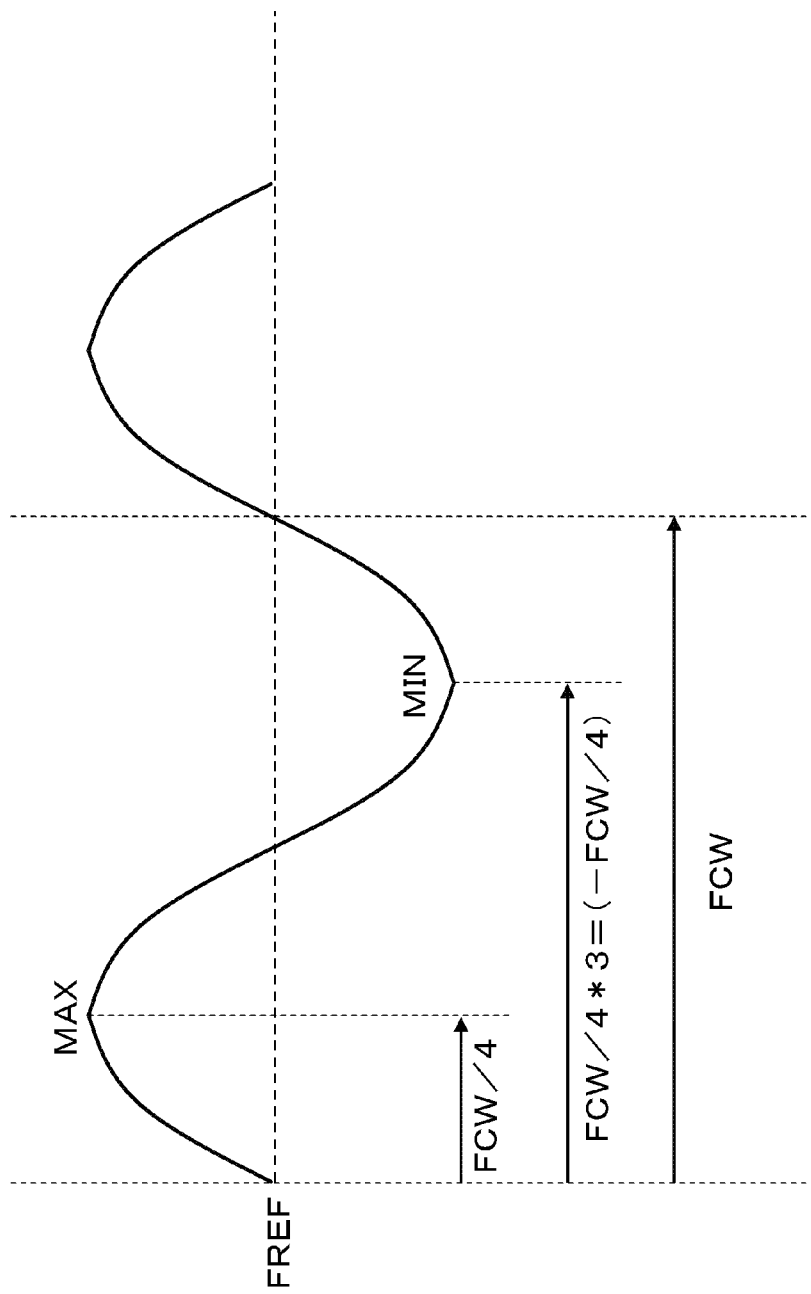
FIG. 12 illustrates correspondence between amplitude of a reference signal and a frequency command word.
Figure 13:
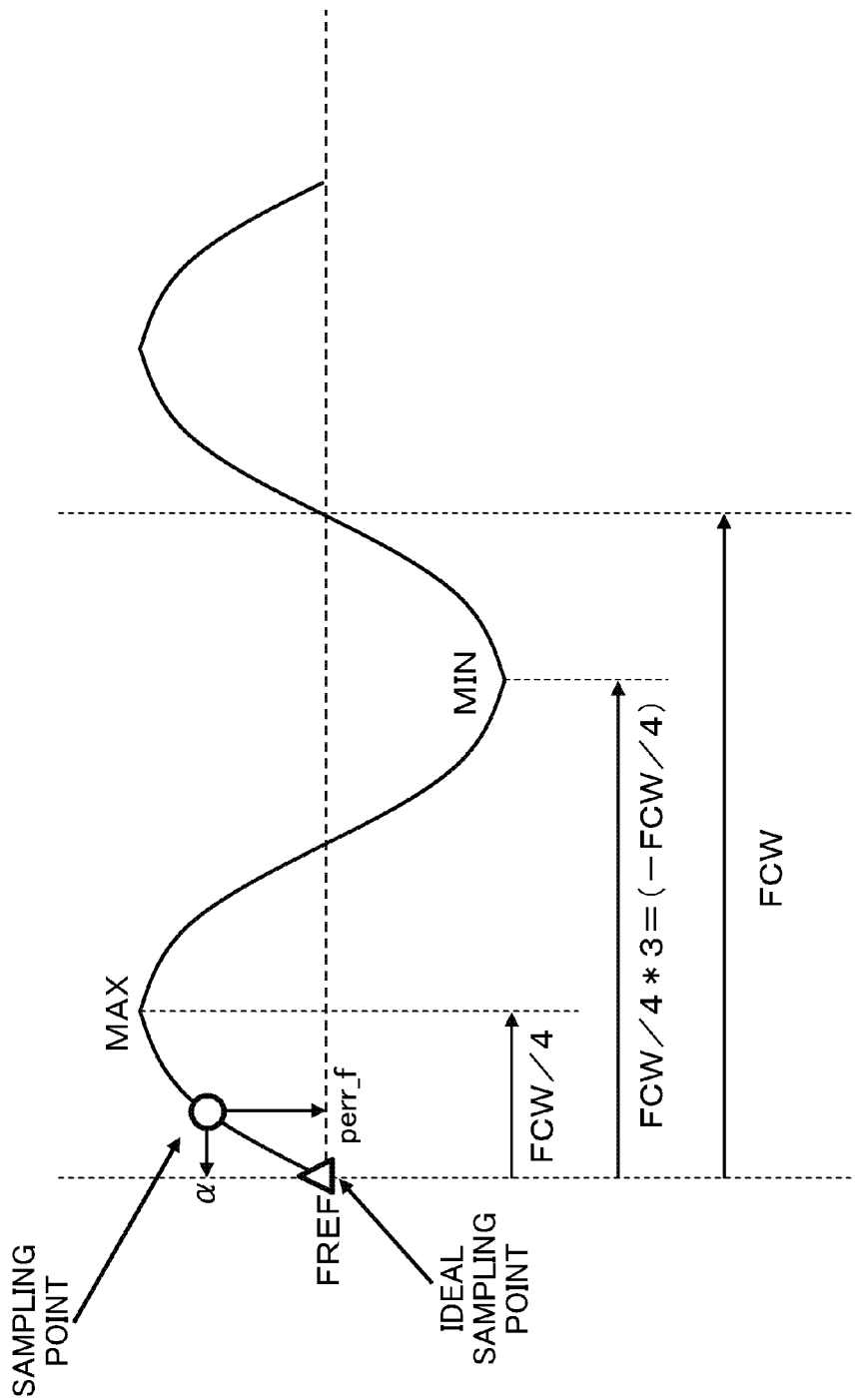
FIG. 13 illustrates an example sampling point.

Next, a calculation method of the normalization coefficient will be described. The frequency command word FCW has a value which is the normalized oscillation frequency of the output clock CKV1 by the frequency of the reference signal FREF. Thus, ideally, where the period of the output clock CKV1 is one, one period of the reference signal FREF is the frequency command word FCW. FIG. 12 illustrates where the reference signal FREF has a waveform close to a sine wave. In this case, the maximum value of the amplitude of the reference signal FREF corresponds to FCW/4, and the minimum value corresponds to FCW/4*3=(-FCW/4). FIG. 13 illustrates an example sampling point. At the sampling point shown in FIG. 13, where the position of an ideal sampling point is phase error 0, and the corresponding phase error is perr_f, and the amplitude value is α; the following equations (2) can be obtained, thereby calculating the minute phase error using the amplitude information α. Therefore, the amplitude value α can be normalized using the maximum value and the minimum value of the reference signal FREF, and the frequency command word FCW. In the following equations (2), FCW/4·1/|MAX−MIN| is the normalization coefficient to be calculated by the coefficient calculation section 10733.

$$\frac{FCW}{4} \cdot |MAX - MIN| = perr\_f \cdot |\alpha - MIN|$$

$$\therefore perr\_f = \frac{FCW}{4} \cdot \frac{|\alpha - MIN|}{|MAX - MIN|}$$

Equations 2

Note that the normalization may be made by a means using a look-up table. Also, similar performance can be provided using a signal with a sowtooth waveform as the reference signal FREF. If a signal with a square wave is used as the reference signal FREF, high frequencies are preferably filtered by a low-pass filter.

Figure 14:
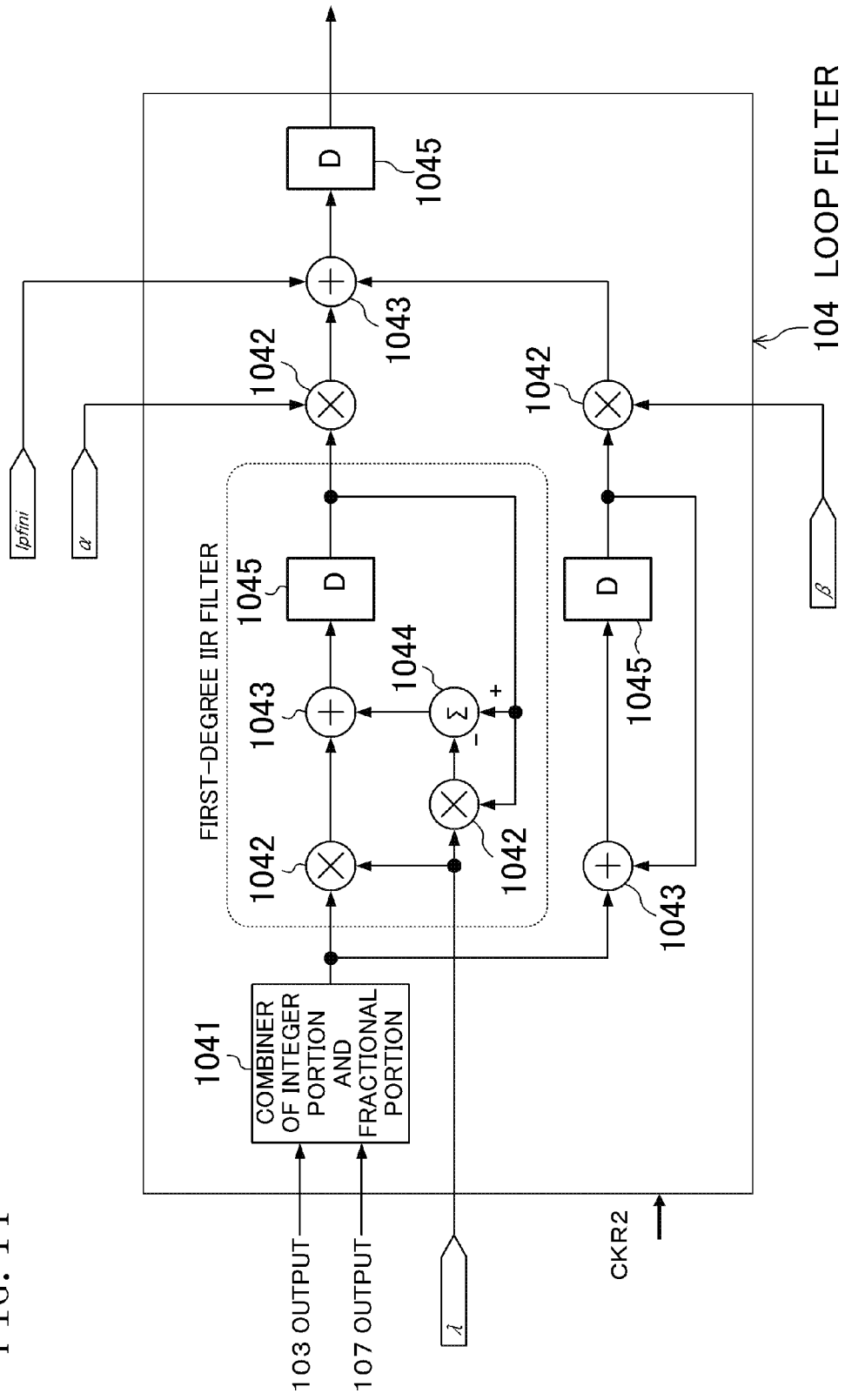
FIG. 14 illustrates an internal configuration of a loop filter included in the digital PLL circuit.

Next, FIG. 14 illustrates an example configuration of the loop filter (filter section) 104 shown in FIG. 1. In the figure, 1041 denotes a combiner of the integer portion and the fractional portion, 1042 denotes a multiplier, 1043 denotes an adder, 1044 denotes a subtractor, and 1045 denotes a register circuit driven by a retiming delay signal CKR2. The combiner 1041 combines an output of the phase comparator 103 as the integer portion with an output of the minute phase error generator 107 as the fractional portion to input to the loop filter 104. In this example configuration, the loop filter 104 mainly includes a first-order IIR filter and an integral term, and performs filtering by obtaining the sum of outputs of the first-order IIR filter and the integral term. Characteristics can be easily changed depending on coefficients such as α, β, and γ, and parameters such as the initial value lpfini of an output of the filter. Input phase errors are smoothed by using such the circuit.

Furthermore, the control amount generator 105 of FIG. 1 generates a control amount for controlling the controlled oscillator 106 based on the output of the loop filter 104. In a digital PLL circuit, the control amount for the controlled oscillator 106 has limited resolution. Thus, in order to increase the resolution to the level of analog circuits, ΔΣ modulation etc. may be used for minute portions of the control amount.

Figure 15:
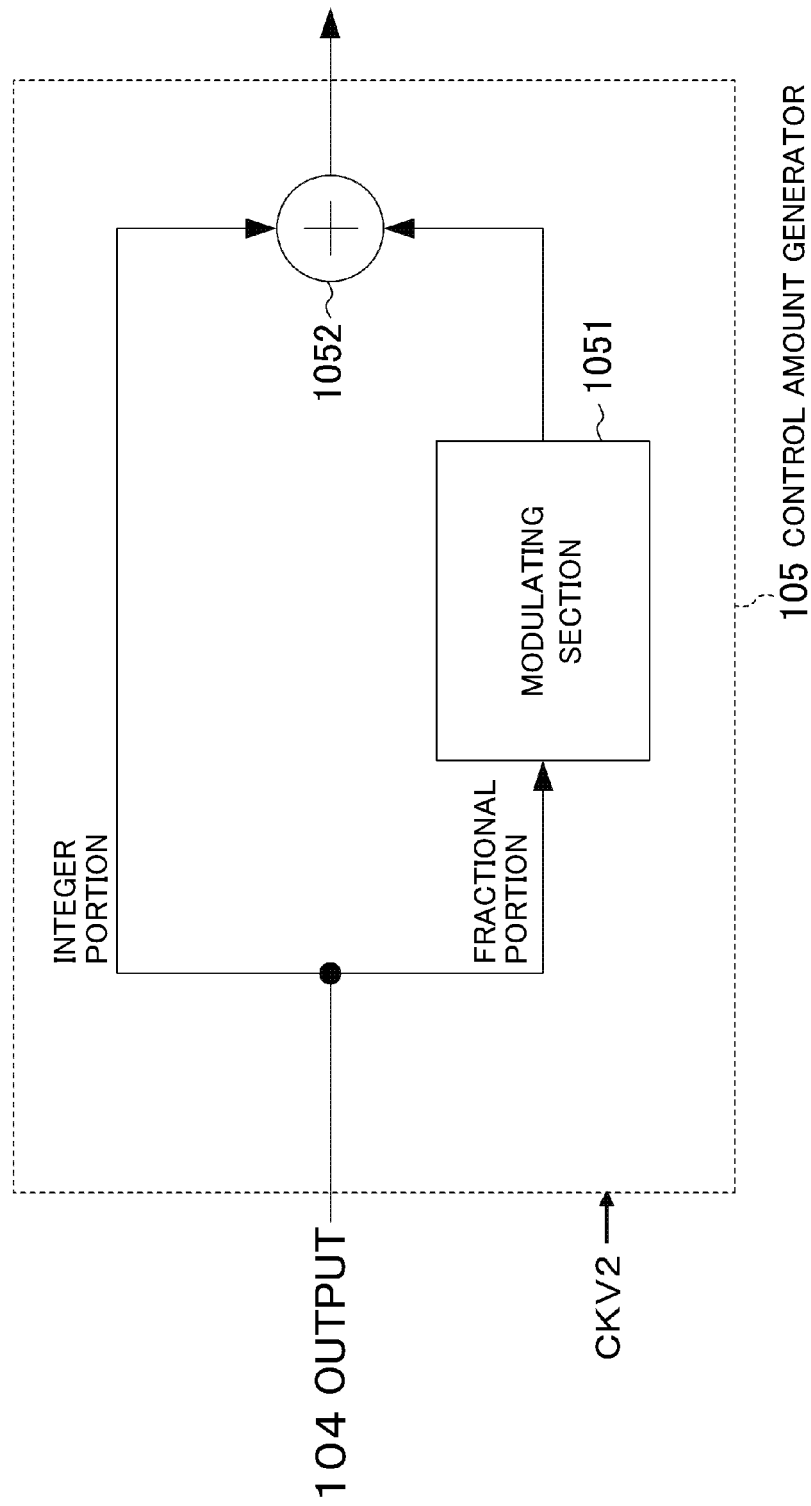
FIG. 15 illustrates an internal configuration of a control amount generator included in the digital PLL circuit.

FIG. 15 illustrates an example internal configuration of the control amount generator 105. In the figure, 1051 denotes a modulating section, and 1052 denotes an adder. The modulating section 1051 performs modulating on the fractional portion of the output of the loop filter 104. The adder 1052 sums the integer portion of the output of the loop filter 104 and the output of the modulating section 1051 to generate the control amount.

Figure 16:
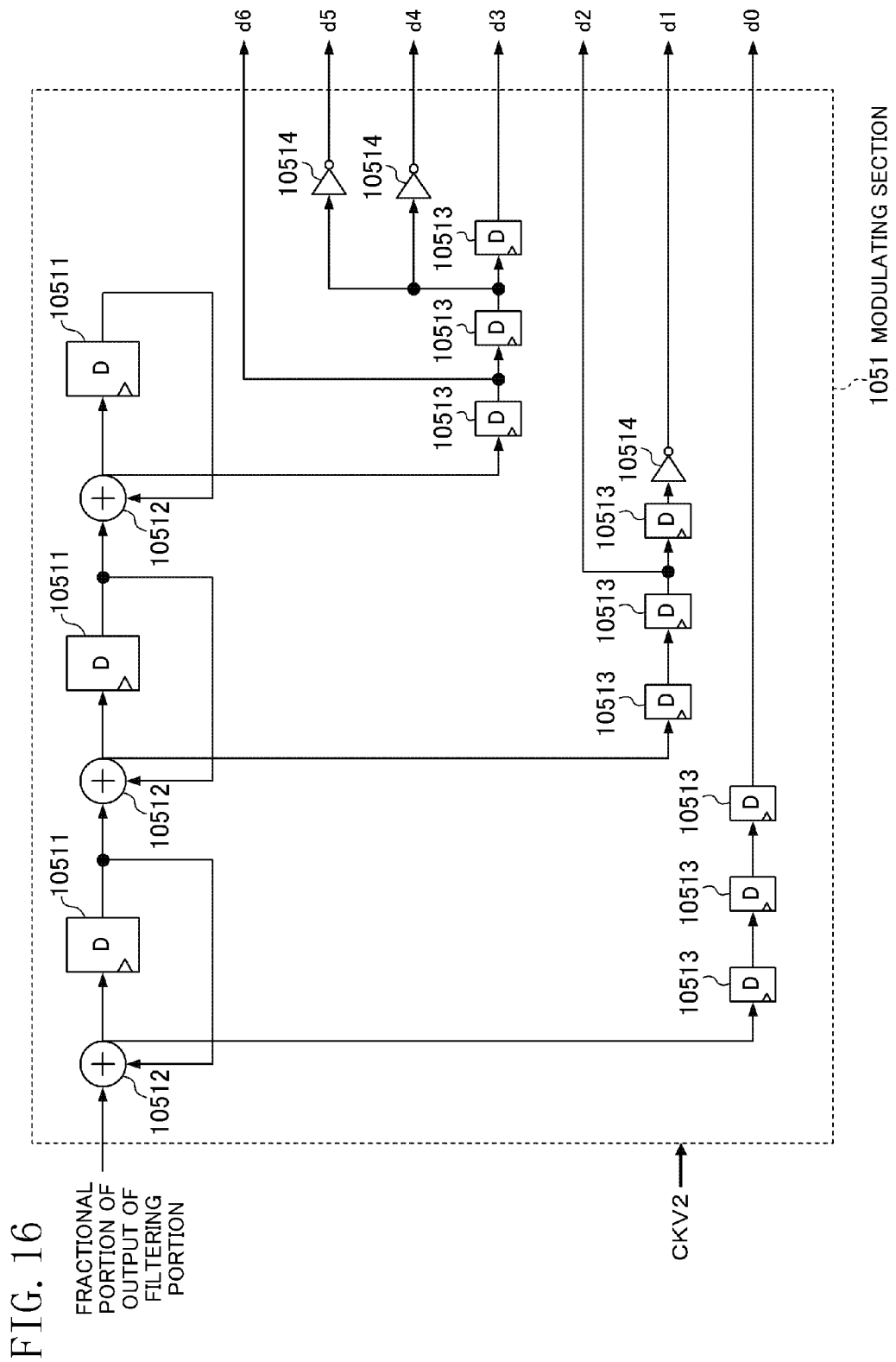
FIG. 16 illustrates an internal configuration of a modulating section included in the control amount generator.

FIG. 16 illustrates an example internal configuration of the modulating section 1051. In the figure, 10511 and 10513 denote register circuits driven by an input clock signal CKV2, 10512 denotes an adder, and 10514 denotes an inverter. An input is the fractional portion of the output of the loop filter 104. The adder 10512 adds the fractional portion of the output of the look filter 104 and a value stored in the register circuit 10511. Of the sum result, the fractional portion is stored in the register circuit 10511, and carry is stored in the register group 10513. By modulating the fractional portion of the output of the loop filter 104 as described above, noise shaping can be performed. Since a clock driving the modulated portion needs to be set to a higher frequency to some degree than the output clock CKR1, a clock signal CKV2 is used, which has a divided frequency of the output clock CKV1. Timing with a higher portion of the output of the loop filter 104, which is not modulated, needs to be synchronized by the clock signal CKV2. Note that modulating at the modulating section 1051 may be performed not only on the fractional portion of the output of the loop filter 104 but also on the integer portion.

The controlled oscillator 106 shown in FIG. 1 outputs a clock signal CKV1 with a frequency based on the control amount according to the control amount generator 105.

Figure 17:
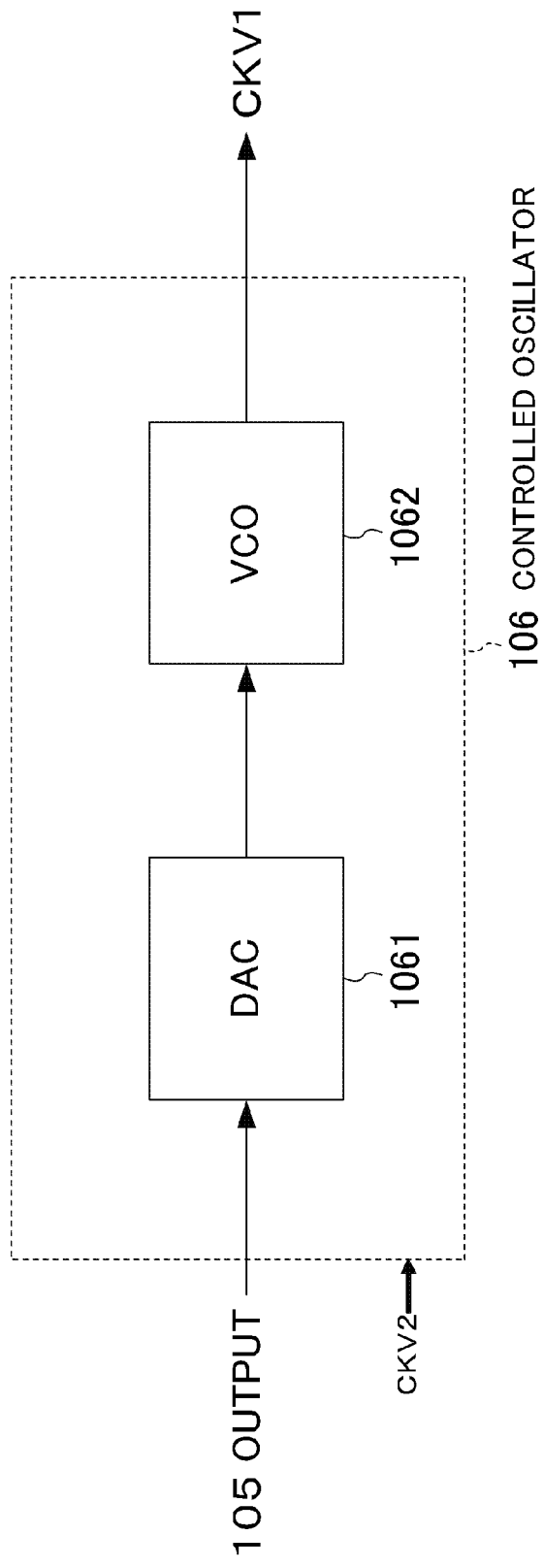
FIG. 17 illustrates an internal configuration of a controlled oscillator included in the digital PLL circuit.

FIG. 17 illustrates an example configuration of the controlled oscillator 106. In the figure, 1061 denotes a digital-to-analog converter (DAC), and 1062 denotes a voltage controlled oscillator (VCO). The DAC 1061 converts the control amount output from the control amount generator 105 to a voltage level. The VCO 1062 outputs a clock signal CKV1 with a variable frequency based on the voltage level output from the DAC 1061.

Figure 18:
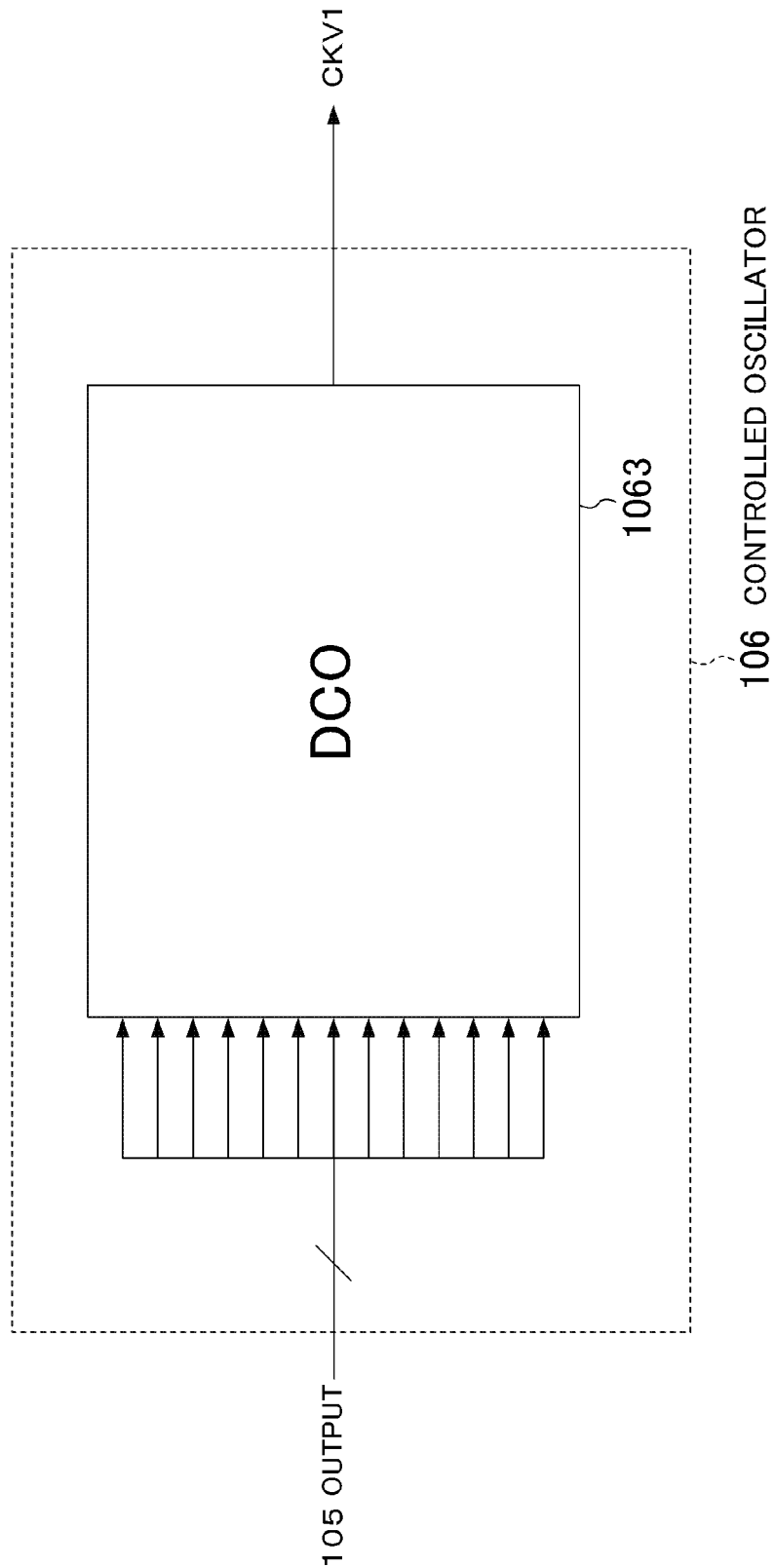
FIG. 18 illustrates another configuration of the controlled oscillator.

FIG. 18 illustrates another example configuration of the controlled oscillator 106. In the figure, 1063 denotes a digitally controlled oscillator (DCO). The DCO 1063 turning on/off a switch of an internal capacitor (a varactor) based on the control amount according to the control amount generator 105, thereby outputting the clock signal CKV1 with a variable frequency.

As described above, in the digital PLL circuit, a minute phase error between the reference signal FREF and the output clock CKV can be calculated using the amplitude value of the reference signal FREF and the corresponding phase error. This improves phase noise characteristics of the PLL circuit, and reduces the area, power consumption, and design difficulty at the same time.

While in this embodiment, an example has been described where the clock signal driving the VPA 102 and the gate circuit 108 is the output clock CKV1 output from the controlled oscillator 106, similar advantages can be obtained by using a signal with a divided frequency of the output of the controlled oscillator 106.

Figure 19:
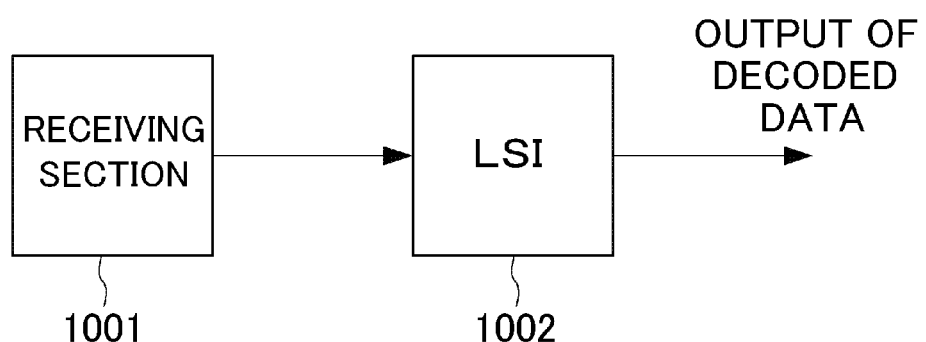
FIG. 19 illustrates a schematic configuration of a communication device with an LSI including the digital PLL circuit.
Figure 20:
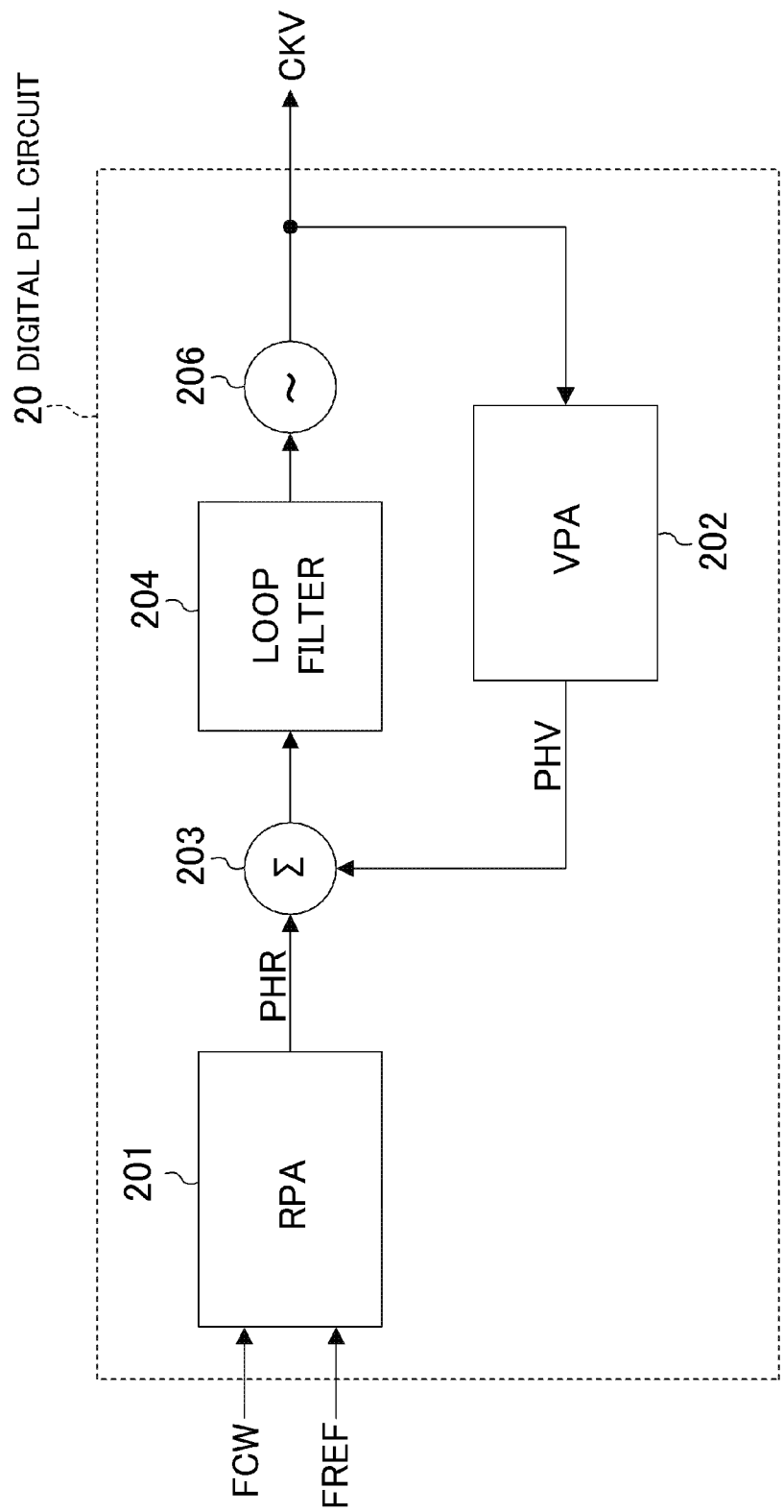
FIG. 20 is a block diagram illustrating a configuration of a conventional digital PLL circuit.
Figure 21:
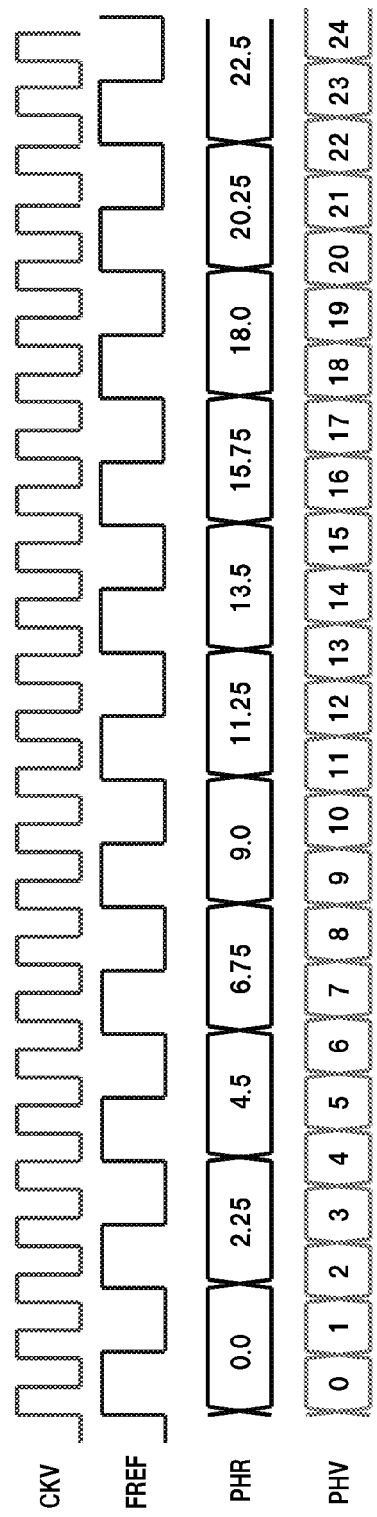
FIG. 21 is an operation timing chart of the conventional digital PLL circuit.
Figure 22:
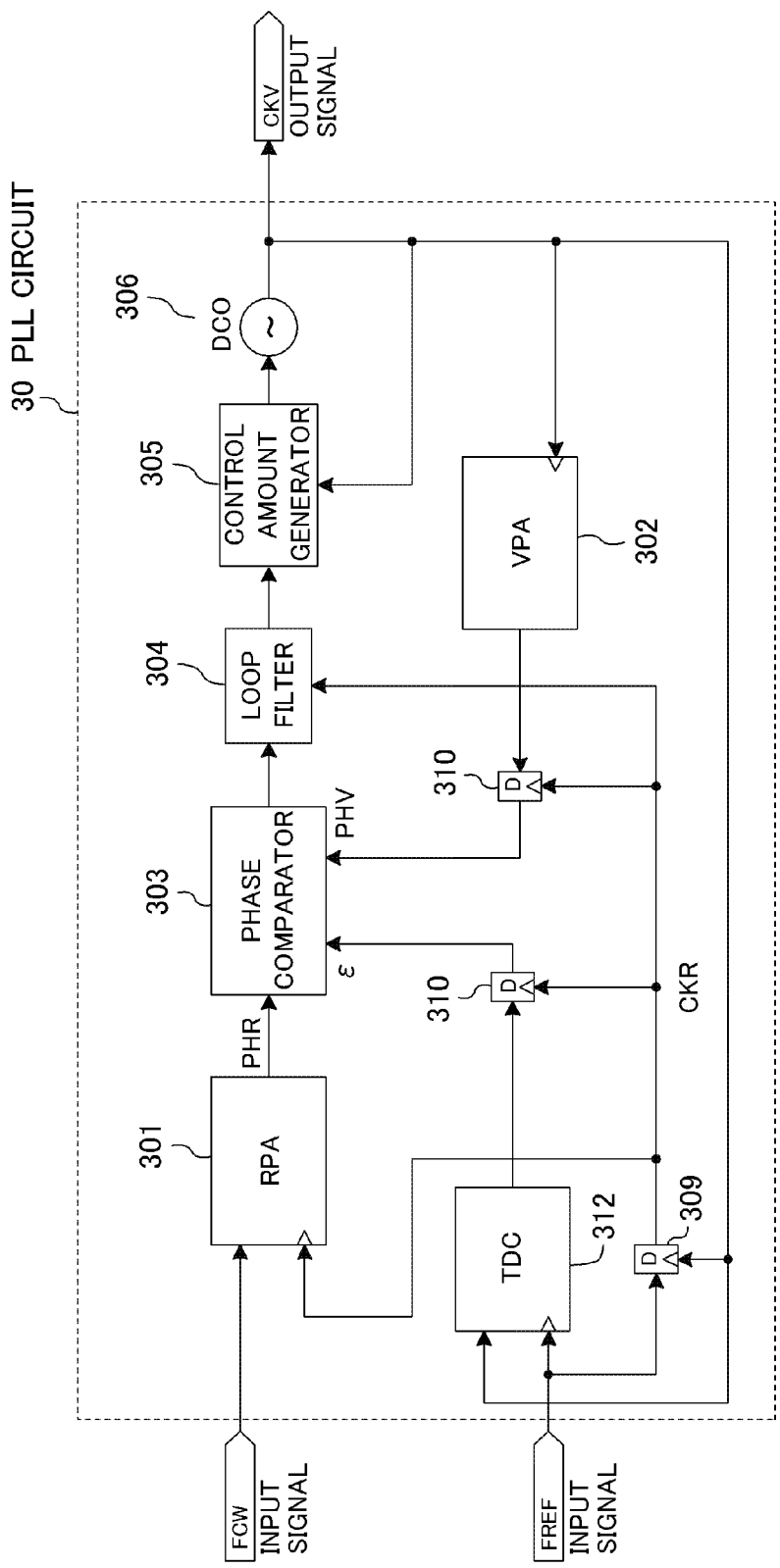
FIG. 22 illustrates the entire configuration of another conventional PLL circuit.
Figure 23:
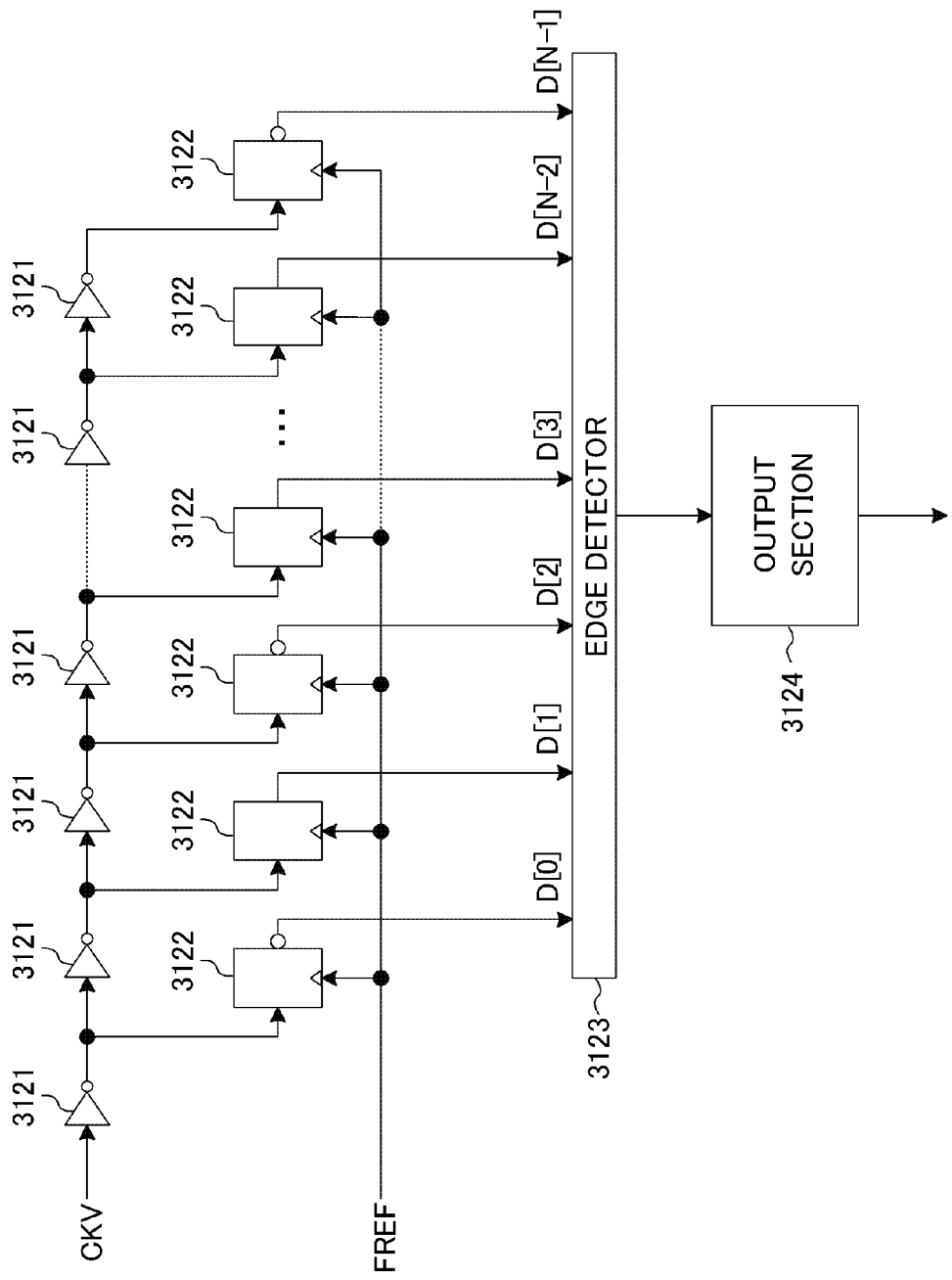
FIG. 23 illustrates an internal configuration of a TDC included in the other conventional PLL circuit.
Figure 24A:
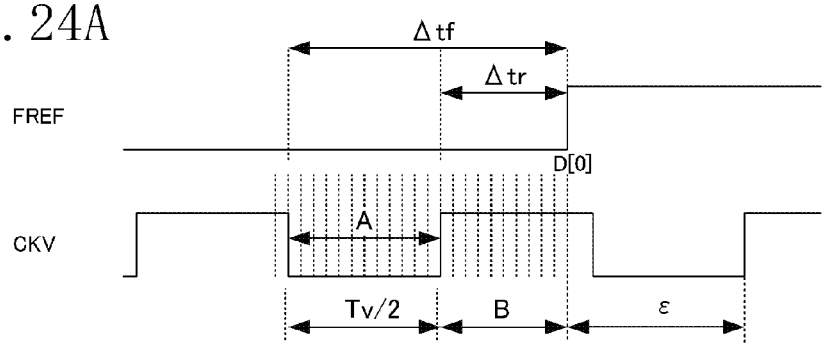
FIG. 24A-24D illustrate a method of calculating a minute digital phase error in the other conventional PLL circuit.
Figure 24B:
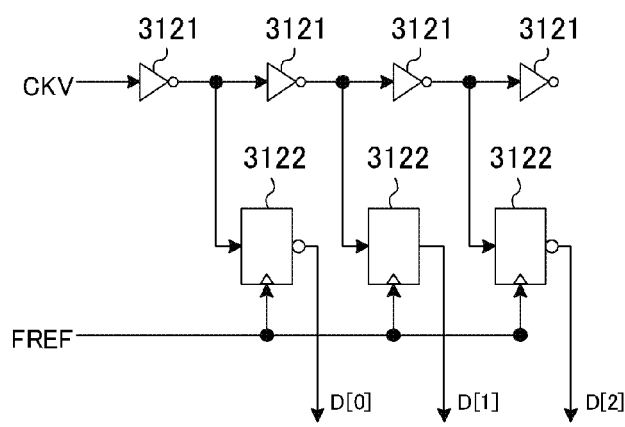
Figure 24C:
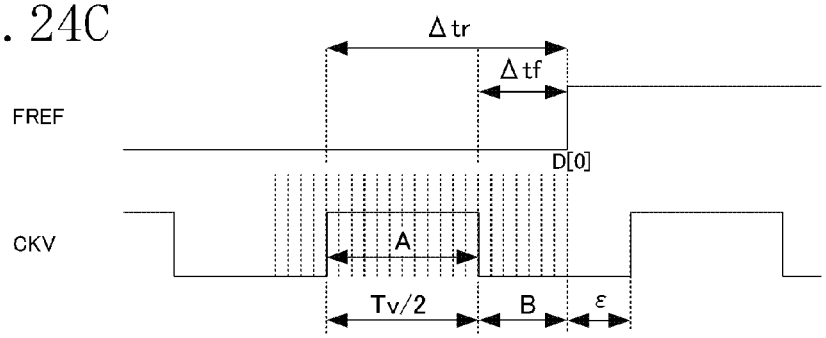
Figure 24D:
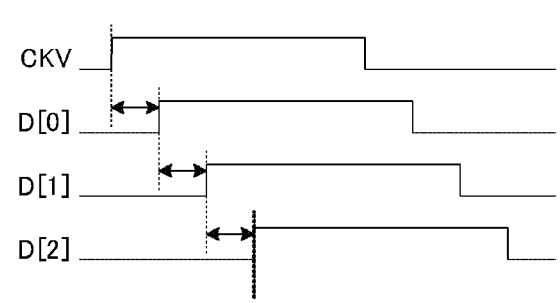

FIG. 19 is a block diagram illustrating the entire schematic structure of a communication device with an LSI including the digital PLL circuit of the present disclosure. For example, assume that the communication device is a radio tuner. In the figure, 1001 denotes a receiving section such as an antenna, 1002 denotes an LSI receiving a signal received at the receiving section 1001, and including the digital PLL circuit of the present disclosure and a signal processing circuit performing waveform equalization and decode of the received signal. The decoded data output from the LSI 1002 is converted to sound, and video data is displayed on a display terminal (not shown).

While an example has been described using a radio tuner, the present disclosure is applicable to various systems such as other wireless communication devices, wired communication devices, data processing devices, communication devices, video display devices, etc. requiring a PLL circuit.

As described above, in the present disclosure, even when a frequency command word (a frequency ratio) contains a fractional component, the number of provided comparators can be reduced, thereby reducing the area, power consumption and design difficulty, and calculating a minute phase error between a reference signal and an output clock. With these features, the present disclosure provides a digital PLL circuit with excellent phase noise characteristics, and is thus, applicable to data processing devices, communication devices, video display devices, etc. using the digital PLL circuit.

What is claimed is:

1. A digital PLL circuit receiving a reference signal and outputting a clock signal with a frequency obtained by multiplying a frequency of the reference signal by a value indicating a predetermined magnification ratio and containing an integer portion and a fractional portion, the circuit comprising:
   a controlled oscillator configured to receive a control amount and change the frequency of the clock signal output from the digital PLL circuit in accordance with the received control amount;
   a first counter configured to count the clock signal with the frequency changed by the controlled oscillator;
   a second counter configured to increment the predetermined magnification ratio in response to a retiming signal obtained by retiming the reference signal with the clock signal from the controlled oscillator;
   a comparator configured to compare a count value of the first counter to an integer portion of a count value of the second counter and output the difference as a phase error of the integer portion;
   a minute phase error generator configured to generate a plurality of threshold values close to an amplitude value of the reference signal based on the fractional portion of the count value of the second counter, detect the amplitude value of the reference signal based on the plurality of threshold values, and generate minute phase error information as a phase error of the fractional portion between the reference signal and the output clock signal from the controlled oscillator based on the detected amplitude value;
   a filter section configured to receive the phase error of the integer portion from the comparator and the minute phase error information as the phase error of the fractional portion from the minute phase error generator, and smooth a sum of the two phase errors; and
   a control amount generator configured to generate and output the control amount for the controlled oscillator based on an output of the filter section.

2. The digital PLL circuit of claim 1, wherein
the minute phase error generator includes
   a plurality of threshold banks, each configured to output a plurality of threshold values,
   a selection section configured to receive the fractional portion of the count value of the second counter, and select one of the plurality of threshold banks based on the fractional portion, and
   a plurality of comparators provided in number equal to the number of the threshold values output from the threshold bank selected by the selection section, and configured to receive the corresponding threshold values from the selected threshold bank, receive the reference signal, and compare the reference signal to the received threshold values.

3. The digital PLL circuit of claim 1, wherein
the minute phase error generator detects amplitude values of the reference signal a plurality of times based on the generated plurality of threshold values, and generates minute phase error information as a phase error of the fractional portion between the reference signal and the output clock signal from the controlled oscillator based on a maximum value, a minimum value, and an amplitude value just before the second counter increments the predetermined magnification ratio out of the detected plurality of amplitude values, and the predetermined magnification ratio containing the integer portion and the fractional portion.

4. The digital PLL circuit of claim 3, wherein
the minute phase error generator detects the amplitude value just before the second counter increments the predetermined magnification ratio at thinning of the clock signal output from the digital PLL circuit in accordance with an output of the first counter and an output of the second counter.

5. The digital PLL circuit of claim 3, wherein
the minute phase error generator switches the plurality of threshold banks and detects the maximum value and the minimum value of the amplitude values of the reference signal when the PLL circuit is in transition to normal operation or in a learning mode, and normalizes the minute phase error using the detected maximum and minimum values in the normal operation after the transition.

6. The digital PLL circuit of claim 1, wherein
the count value of the first counter and the count value of the second counter are held in two respective register circuits synchronized with the retiming signal, and
the comparator compares the count value of the first counter held in one of the two register circuits to the integer portion of the count value of the second counter held in the other register circuit.

7. The digital PLL circuit of claim 1, wherein
the control amount generation section outputs to the controlled oscillator, a result of modulating a part or whole of the control amount for the controlled oscillator as a control amount.

8. The digital PLL circuit of claim 1, wherein
the controlled oscillator includes a digital-to-analog converter and a voltage controlled oscillator.

9. The digital PLL circuit of claim 1, wherein
the controlled oscillator is a digital controlled oscillator.

10. The digital PLL circuit of claim 1, wherein
the reference signal has a waveform equivalent to a sine wave.

11. The digital PLL circuit of claim 1, wherein
the reference signal has a sowtooth waveform.

12. A communication device comprising:
an LSI including a signal processing circuit configured to decode a received signal containing sound data or video data with a clock signal obtained by using the digital PLL circuit of claim 1; and
a display terminal configured to receive the decoding signal from the LSI, and display the decoded sound data or the decoded video data.

\* \* \* \* \*